United States Patent
Kita et al.

(10) Patent No.: US 7,141,911 B2
(45) Date of Patent: Nov. 28, 2006

(54) DRIVING METHOD OF PIEZOELECTRIC ACTUATOR, PIEZOELECTRIC ACTUATOR, AND DISK RECORDING AND REPRODUCING APPARATUS USING THE SAME

(75) Inventors: Hiroyuki Kita, Osaka (JP); Hideki Kuwajima, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 1 day.

(21) Appl. No.: 10/712,305

(22) Filed: Nov. 14, 2003

(65) Prior Publication Data

US 2004/0135472 A1 Jul. 15, 2004

(30) Foreign Application Priority Data

Nov. 15, 2002 (JP) .............................. 2002-331904

(51) Int. Cl.
*H01L 41/08* (2006.01)
(52) U.S. Cl. ..................... 310/317; 310/311; 310/358
(58) Field of Classification Search ..................... None
See application file for complete search history.

(56) References Cited

U.S. PATENT DOCUMENTS

| | | | |
|---|---|---|---|
| 3,072,805 A | | 1/1963 | Rich |
| 3,902,084 A | * | 8/1975 | May, Jr. ...................... 310/328 |
| 4,093,885 A | * | 6/1978 | Brown ........................ 310/331 |

(Continued)

FOREIGN PATENT DOCUMENTS

EP 0 767 503 A1 4/1997

(Continued)

OTHER PUBLICATIONS

I. Kanno et al., "Piezoelectric Properties of C-Axis Oriented Pb(Zr,Ti)O$_3$ Thin Films", pp. 1378-1380, Appl. Phys. Lett. 70(11), Mar. 17, 1997.

(Continued)

*Primary Examiner*—Mark Budd
(74) *Attorney, Agent, or Firm*—McDermott Will & Emery LLP

(57) ABSTRACT

In a disclosed method, a piezoelectric element 1 has an asymmetrical hysteresis characteristic of polarization-electric field different in absolute values between a coercive field of positive electric side and a coercive field of negative electric field side, and is polarized in the film thickness direction of the piezoelectric element 1 and in a direction of smaller absolute value of the coercive field, and as a position control voltage Q1 for position control by ditorting the piezoelectric element 1 in a direction orthogonal to the film thickness direction of the piezoelectric element 1, a voltage equivalent to an electric field of 0.4 or less of the coercive field value is applied in the film thickness direction of the piezoelectric element 1 in a direction of larger absolute value of the coercive field. Further, a position control voltage Q2 for recovering from deterioration of polarization of the piezoelectric element 1 is applied by superposing on the position control voltage Q1, or changing over with the position control voltage Q1, or while the position control voltage Q1 is not applied, and therefore recovering from deterioration of polarization characteristic, the displacement characteristic is stabilized for a long period of time.

22 Claims, 15 Drawing Sheets

U.S. PATENT DOCUMENTS

| | | | |
|---|---|---|---|
| 4,237,399 A * | 12/1980 | Sakamoto | 310/317 |
| 4,663,555 A * | 5/1987 | Yoshihiro | 310/317 |
| 4,851,871 A * | 7/1989 | Ooe et al. | 396/242 |
| 5,138,217 A * | 8/1992 | Wada et al. | 310/323.21 |
| 5,448,067 A * | 9/1995 | Micheli et al. | 250/338.2 |
| 5,568,003 A * | 10/1996 | Deck | 310/316.01 |
| 6,046,525 A * | 4/2000 | Shiozawa | 310/317 |
| 6,081,063 A * | 6/2000 | Kasuga et al. | 310/323.02 |
| 6,285,115 B1 * | 9/2001 | Gallmeyer et al. | 310/317 |

FOREIGN PATENT DOCUMENTS

| | | |
|---|---|---|
| EP | 1 202 273 A2 | 5/2002 |
| JP | 62-057265 | 3/1987 |
| JP | 03-98478 | 4/1991 |

OTHER PUBLICATIONS

Yukihiro Uematsu, "Switching to Super-High TPI and Piggy-Back Actuator", pp. 4-7, IDEMA Japan News No. 32 with partial translation.

Dunn et al., "Substrate effects on domain structutes of PZT 30/70 sol-gel films via PiezoAFM" Journal of the European Ceramic Society, Elsevler Science Publishers, Barking, Essex, GB, vol. 22, No. 6, 2002, pp. 825-833, XP004339372.

Kanno et al., "Piezoelectric properties of c-axis oriented PbZr, Ti)O$_3$ thin films", Applied Physics Letters, AIP, American Institute of Physics, Melville, NY, US, vol. 70, No. 11, Mar. 17, 1997, pp. 1378-1380, XP012017420.

* cited by examiner

DRIVING METHOD OF PIEZOELECTRIC ACTUATOR, PIEZOELECTRIC ACTUATOR, AND DISK RECORDING AND REPRODUCING APPARATUS USING THE SAME

FIELD OF THE INVENTION

The present invention relates to a piezoelectric actuator using a thin film piezoelectric element and its driving method, and a disk recording and reproducing apparatus mounting the piezoelectric actuator.

BACKGROUND OF THE INVENTION

Micro machines are intensively developed recently, such as ultrasmall piezoelectric actuators, motors and pumps, by utilizing the micro machine technology. Among them, the piezoelectric actuator is developed for ink jet printer or use in head positioning in a disk recording and reproducing apparatus (hereinafter called disk apparatus) in which positioning of high precision is demanded in a miniature region.

For use in a disk apparatus, for example, it is developed as follows. Usually, a head for recording and reproducing information in a disk-shape recording medium (hereinafter called disk) is mounted on a head slider, and is attached to an actuator arm. By oscillating this actuator arm by a voice coil motor (hereinafter called VCM), it is positioned on a desired track position on the disk, and information is recorded or reproduced by the head. As the recording density is enhanced, however, sufficient positioning precision can be no longer assured by the conventional VCM alone.

Therefore, in addition to the positioning means using the VCM, it has been proposed to position at higher speed and higher precision by finely driving the head slider by using fine positioning means by a piezoelectric actuator using a piezoelectric element (Ultrahigh TPI and piggyback actuator, IDEMA Japan News No. 32, pp. 4–7, International Disk Drive Association).

The piezoelectric elements used in such piezoelectric actuator may be manufactured by green sheet laminating method, multilayer ceramic method formed by thick film multilayer lamination, or thin film method fabricated by thin film technology.

In the piezoelectric actuator using these piezoelectric elements, displacement of the piezoelectric element deteriorates in the course of time due to impression of voltage. In order that the piezoelectric actuator may operate stably without such aging or deterioration, it is required to suppress changes of initial polarization characteristic of the piezoelectric element. Various measures of stabilization of polarization are devised in the manufacturing process.

For example, to stabilize the polarization characteristic, in a piezoelectric actuator manufactured in a conventional manner, sinusoidal waves oscillating from 0 voltage to maximum operating voltage of the piezoelectric actuator are applied for more than 1 hour, preferably about 10 hours, and the piezoelectric actuator is stabilized (Japanese Patent Publication No. 2814607, FIG. 3).

In this method, prior to use of the piezoelectric element, it is stabilized by applying sinusoidal waves ranging from, for example, 0 V to 150 V. However, when such high voltage is applied for 1 hour, or preferably as long as 10 hours, the insulation resistance may deteriorate in the case of the piezoelectric element fabricated by the thin film technology. Further, since such method is intended to stabilize by slightly decreasing initial displacements of the piezoelectric actuator, and as compared with the displacement in the initial polarization state, the displacement is smaller in the actual operating state, and the performance as the piezoelectric actuator is slightly lowered.

Concerning an asymmetric hysteresis characteristic of a piezoelectric thin film, it is proposed to form a platinum (Pt) film of (100) azimuth on a single-crystal magnesium oxide (MgO) substrate of (100) azimuth, and form a (001) oriented lead zirconic titanate (PTZ) film thereon by sputtering method (Appl. Phys. Lett. 70 (11), 1378–1380, 17 Mar. 1997, "Piezoelectric properties of c-axis oriented Pb (Zr, Ti) $O_3$ thin film"). This publication, however, teaches nothing about driving method as piezoelectric actuator for stabilizing polarization of piezoelectric element or preventing deterioration of insulation resistance.

SUMMARY OF THE INVENTION

It is hence a primary object of the invention to present a driving method of piezoelectric actuator stable for a long period of time and capable of obtaining a large displacement continuously by recovering from deterioration of polarization characteristic in a state of mounting a piezoelectric actuator using a piezoelectric element fabricated by thin-film technology, a piezoelectric actuator, and a disk apparatus using the piezoelectric actuator.

In a driving method of piezoelectric actuator of the invention,

- a piezoelectric element has an asymmetrical hysteresis characteristic of polarization-electric field (hereinafter called P-E hysteresis characteristic) different in absolute values between a coercive field of positive electric field side and a coercive field of negative electric field side, and is polarized in the film thickness direction of the piezoelectric element and in a direction of smaller absolute value of the coercive field, and
- as a position control voltage for position control by distorting the piezoelectric in a direction orthogonal to the film thickness direction of the piezoelectric element, a voltage equivalent to an electric field of 0.4 or less of the coercive field value is applied in the film thickness direction of the piezoelectric element in a direction of larger absolute value of said coercive field.

By this driving method, since the piezoelectric element is polarized in a direction of smaller absolute value of the coercive field, the polarization is not disturbed if a position control voltage is applied in a direction of smaller value of the coercive field, and hence displacement is not changed. On the other hand, in a direction of larger absolute value of the coercive field, the position control voltage is smaller than the voltage inducing inversion of polarization, and the polarization is hardly disturbed. As a result, the piezoelectric element of stable displacement can be driven.

Polarization in film thickness direction means an average state of polarization as seen in the entire film, and it is not always required that all domains of the piezoelectric thin film are polarized in the film thickness direction, or that the polarization vector is directed in the film thickness direction. The coercive field of the negative field side refers to the intersection of negative field axis and hysteresis curve (hereinafter called negative coercive field $E_{c1}$) on the hysteresis curve of the polarization-electric field of piezoelectric element, and the coercive field of the positive field side refers similarly to the intersection of positive field axis and hysteresis curve (hereinafter called positive coercive field $E_{c2}$) on the hysteresis curve.

In other aspect of driving method of piezoelectric actuator of the invention, a position control voltage is applied to a piezoelectric element polarized in a film thickness direction, in the film thickness direction of the piezoelectric element, and the position is controlled by distorting in a direction orthogonal to the film thickness direction, and a polarization recovery voltage for recovering from deterioration of polarization is superposed and applied on the position control voltage, and is applied by changing over with the position control voltage or applied when the position control voltage is not applied, thereby recovering from deterioration of polarization during position control operation or during pause period of position control operation.

By this driving method, by applying the polarization recovery voltage for recovery from deterioration of polarization to the piezoelectric element by superposing on the position control voltage, by applying by changing over with the position control voltage, or by applying when the position control voltage is not applied, if the displacement deteriorates when the piezoelectric element is driven, the piezoelectric element can be recovered from deterioration of polarization while the piezoelectric actuator is being assembled in the disk apparatus. Thus, the piezoelectric actuator of high precision can be realized at high reliability.

DETAILED DESCRIPTION OF THE EXEMPLARY EMBODIMENTS

Figure 1:
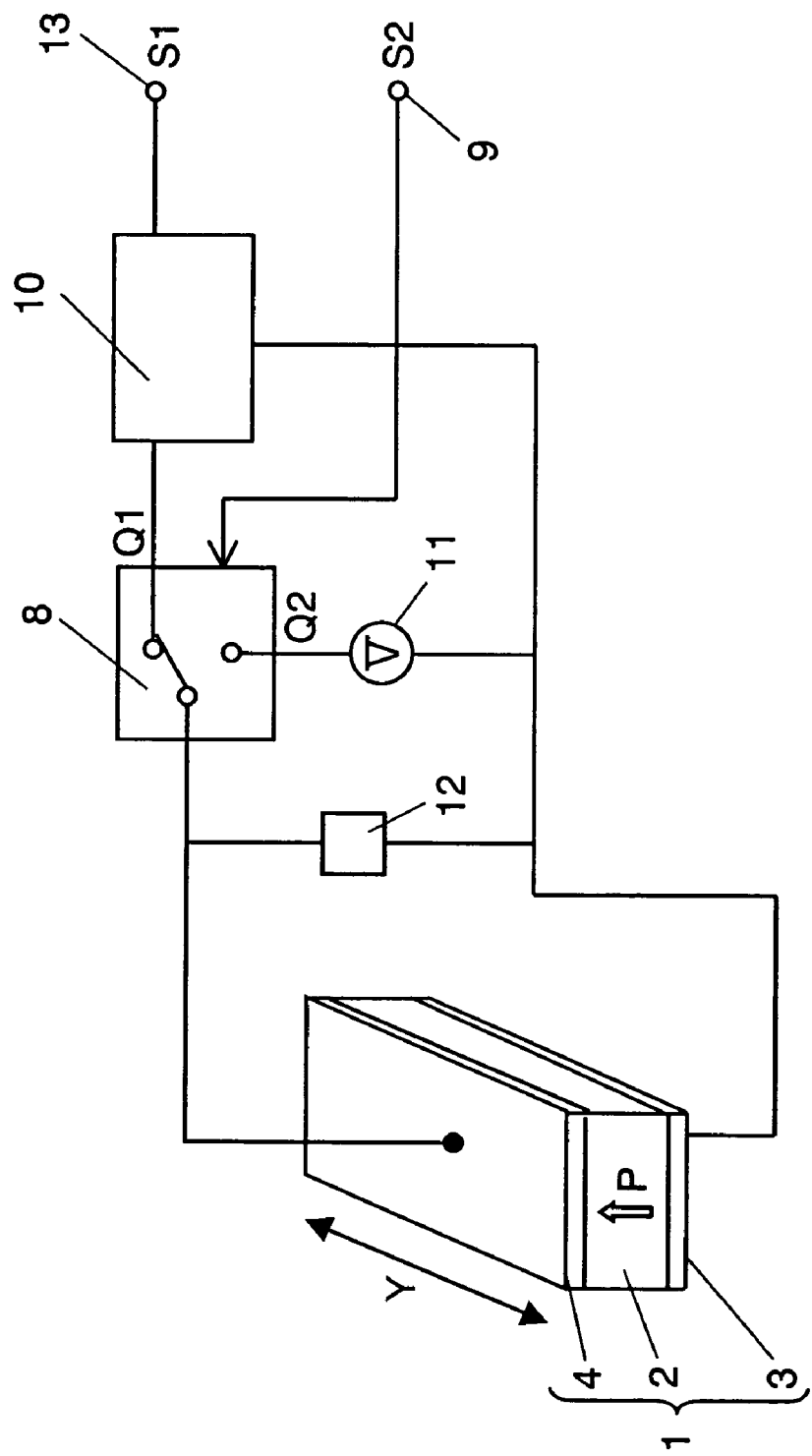
FIG. 1 is a control circuit block diagram of a piezoelectric actuator in a first exemplary embodiment of the invention.

Referring now to the drawings, exemplary embodiments of the invention are specifically described below. In the accompanying drawings, same elements are identified with same reference numerals.

First Exemplary Embodiment

FIG. 1 is a control circuit block diagram of a piezoelectric actuator in a first exemplary embodiment of the invention. A piezoelectric element 1 is composed of a first conductor 3, a second conductor 4, and a piezoelectric thin film 2 enclosed between them. The first conductor 3, second conductor 4, and piezoelectric thin film 2 are formed by sputtering or other thin-film technology, and processed in a box shape as shown by photolithography and etching. Dimensions of the piezoelectric element 1 are 2 mm in the length direction of the direction causing displacement, for example, (direction indicated by Y in FIG. 1), and about 3 μm in thickness. Usually, to make use of the piezoelectric action, it is necessary to induce initial polarization in the piezoelectric element 1. In FIG. 1, the polarization direction is the thickness direction as indicated by arrow P in the diagram. As the hysteresis characteristic, the absolute value of the positive coercive field $E_{C2}$ has a smaller characteristic than the negative coercive field $E_{C1}$. The polarization vector is not always required to be completely vertical to the film surface, and if oblique, its vertical component may be considered, and it is enough when it is in the film thickness direction in average. That is, all domains of the piezoelectric thin film 2 are not required to be polarized in the film thickness direction. The piezoelectric element 1 is not limited to a box shape. Depending on the shape of the apparatus to be used with, it may be formed in trapezoidal, triangular or other shape.

A switch circuit 8 is connected to the first conductor 3 and second conductor 4 enclosing the piezoelectric thin film 2. A position control signal S1 is supplied into a position control voltage circuit 10 from an input terminal 13, and is amplified to be position control voltage Q1 and fed into the switch circuit 8. This position control voltage Q1 and polarization recovery voltage Q2 from a polarization recovery voltage circuit 11 are changed over by the switch circuit 8, and applied into the piezoelectric element 1. During use of the piezoelectric element 1, if deteriorating from the initial polarization characteristic, the polarization recovery voltage Q2 for recovering from deterioration is applied to the piezoelectric element 1 by the switch circuit 8 for the time commanded by switch signal S2 entered in an input terminal 9, that is, for the time enough to restore the polarization characteristic (hereinafter called polarization recovery time H). The upper limit of the polarization recovery voltage Q2 is limited by a limiting circuit 12 of diode and others, and a control circuit is composed.

The circuit block shown in FIG. 1 is explained as an example of the invention, and the switch circuit 8, position control voltage circuit 10, limiting circuit 12 and others may be changed properly depending on the configuration of the apparatus. For example, the limiting circuit 12 is not particularly necessary and omitted if the voltage from the polarization recovery voltage circuit 11 can be controlled precisely and issued.

In this configuration, position control voltage Q1 and polarization recovery voltage Q2 can be freely applied in the piezoelectric element 1 by changing over the switch circuit 8. By impression of position control voltage Q1, the piezoelectric element 1 is distorted in the Y-direction, and this distorting action is utilized as actuator in this exemplary embodiment. That is, fixing one end and setting other end substantially as free end, by fixing the object to be controlled to the free end, the object can be positioned precisely.

Figure 2:
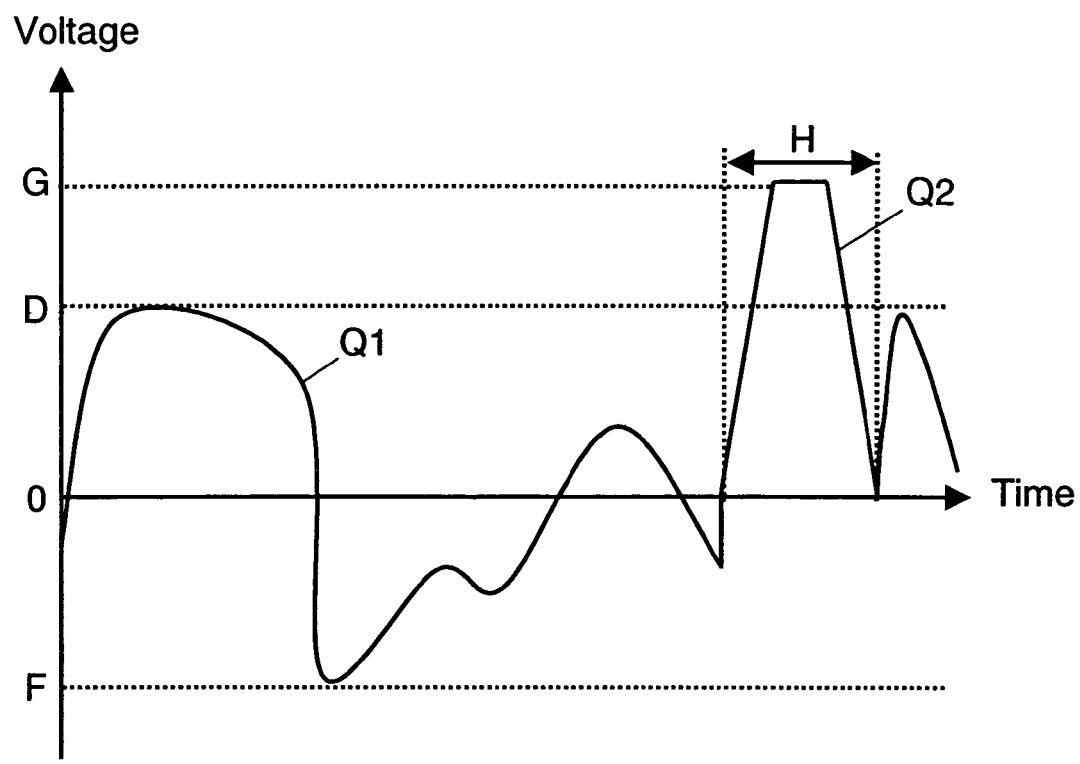
FIG. 2 is a combined waveform diagram of position control voltage and polarization recovery voltage applied to the piezoelectric actuator of the first exemplary embodiment.
Figure 3A:
FIG. 3A is a waveform diagram of position control voltage applied to the piezoelectric actuator of the first exemplary embodiment.
Figure 3B:
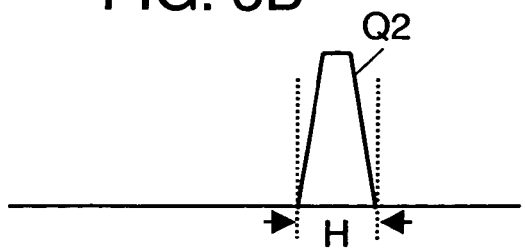
FIG. 3B is a waveform diagram of polarization recovery voltage applied to the piezoelectric actuator of the first exemplary embodiment.

Referring now to FIG. 2, FIG. 3A and FIG. 3B, the voltage applied to the piezoelectric element 1 and the operation for recovering from deterioration of displacement are explained. FIG. 2 is a combined waveform diagram of position control voltage Q1 and polarization recovery voltage Q2, in which a positive voltage is applied in a direction of applying an electric field in the same direction as polarization. FIG. 3A and FIG. 3B are waveform diagrams of position control voltage Q1 and polarization recovery voltage Q2. The displacement of the piezoelectric element 1 is determined by the electric field intensity applied to the piezoelectric thin film 2. When the thickness of the piezoelectric thin film 2 is uniform, the voltage and electric field are in a simple proportional relation, in the following description, instead of the electric field, the position control voltage Q1 and polarization recovery voltage Q2 are explained.

When the polarization characteristic deteriorates during use of the piezoelectric element 1, as shown in FIG. 2, polarization recovery voltage Q2 having larger voltage G than limit value D of position control voltage Q1 as peak value is applied for polarization recovery time H, and the lowered polarization characteristic of the piezoelectric element 1 can be restored. This value G of polarization recovery voltage Q2 is preferably larger than 1 times and smaller than 5 times of the corresponding coercive field, and more preferably in a range of about 1.5 to 2 times. That is, to recover from a disturbed polarization, it is required to apply an electric field at least greater than the coercive field. However, a larger voltage than the coercive field is applied excessively, the insulation resistance is lowered. To avoid such decline of insulation resistance, it is desired to keep within 5 times of the coercive field. In particular, to recover from deterioration of polarization securely and to prevent lowering of insulation resistance, it is most preferred to apply in a range of about 1.5 to 2 times of the coercive field.

To apply the polarization recovery voltage Q2 to the piezoelectric element 1, the polarization recovery voltage Q2 shown in FIG. 3B is applied to the piezoelectric element 1 for the polarization recovery time H by changing over by the switch 8 during impression of the position control voltage Q1 shown in FIG. 3A. This combined voltage waveform is the voltage waveform shown in FIG. 2, and this voltage is applied to the piezoelectric element 1. If the displacement deteriorates during operation of the piezoelectric actuator by applying position control voltage Q1, by applying the polarization recovery voltage Q2 for the polarization recovery time H, the displacement can be recovered.

To apply the polarization recovery voltage Q2, it may be applied periodically by operating the piezoelectric actuator every specific time. Or by applying a voltage to cause a specific displacement to the piezoelectric actuator, for example, the servo signal of the magnetic disk is read by the magnetic head, and detecting means is provided for detecting whether the servo signal level is below a certain threshold or not, and if below the threshold, deterioration is judged and the voltage is applied, or the polarization recovery voltage Q2 maybe applied while the piezoelectric actuator is incorporated in the apparatus, and the method is not specifically limited.

Or while the piezoelectric actuator is not in position control operation, the polarization recovery voltage Q2 may be applied to restore the polarization.

In the exemplary embodiment, the piezoelectric actuator of one-layer structure is described, but by further laminating piezoelectric elements, the piezoelectric actuator may be formed in a laminated structure. By laminating, not only the rigidity is increased, but also the force of causing displacement is increased, and an object of a relatively heavy weight can be positioned at high precision.

Figure 4:
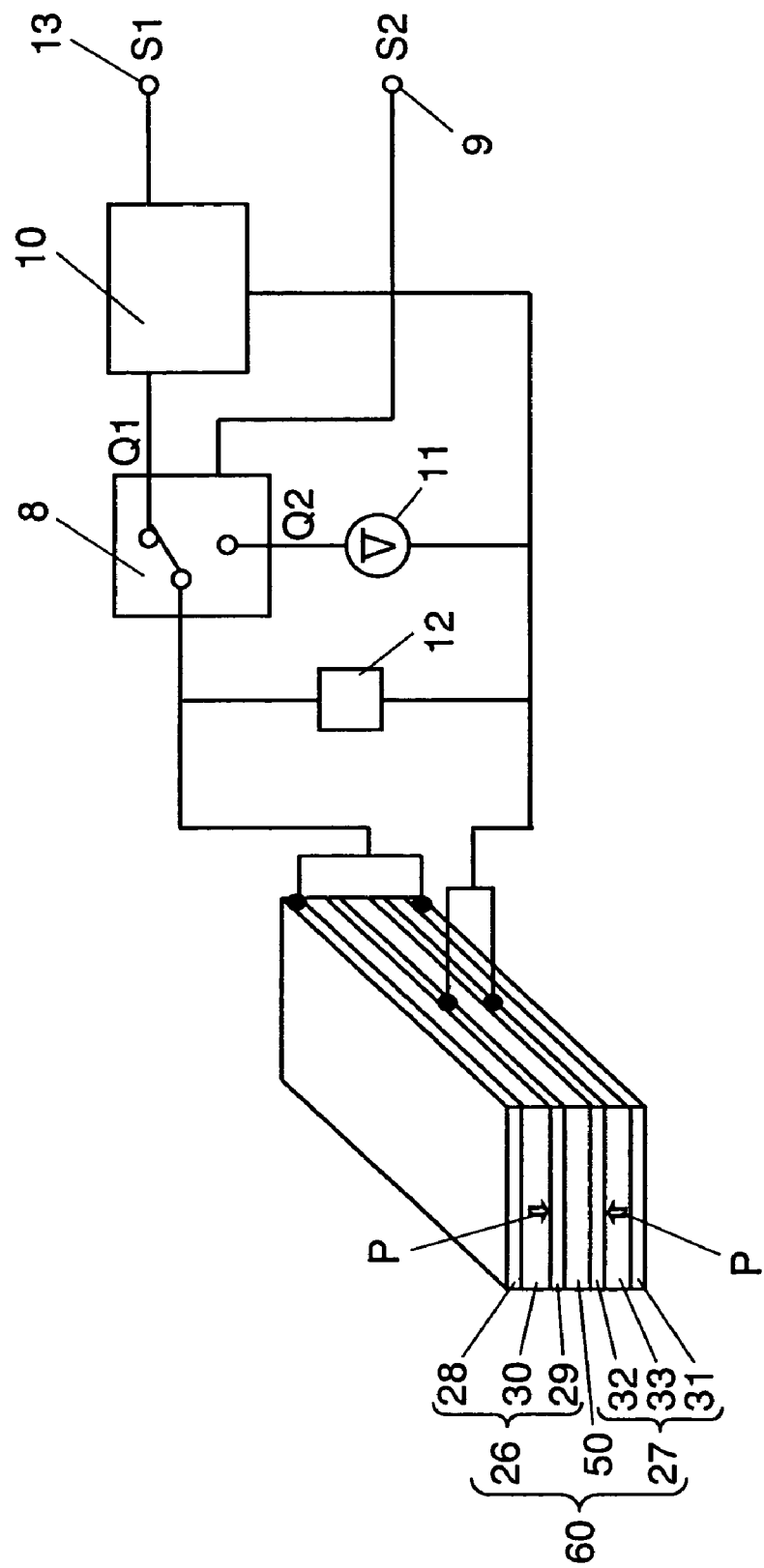
FIG. 4 is a control circuit block diagram of piezoelectric actuator having a piezoelectric element in a double layer laminated structure of the piezoelectric actuator in a modified example of the first exemplary embodiment.

FIG. 4 is a control circuit block diagram of piezoelectric actuator having a piezoelectric element in a double layer laminated structure of the piezoelectric actuator in a modified example of the first exemplary embodiment. A piezoelectric element 26 of first layer is composed of a first conductor 28, a second conductor 29, and a piezoelectric thin film 30 enclosed between them. A piezoelectric element 27 of second layer is composed of a first conductor 31, a second conductor 32, and a piezoelectric thin film 33 enclosed between them. The piezoelectric element 26 of first layer and piezoelectric element 27 of second layer are adhered with an adhesive layer 50 so that each polarization direction P may be opposite to each other, and a laminated piezoelectric body is composed. This laminated piezoelectric body composition is called a laminated piezoelectric element 60 hereinafter. The first conductors 28, 31 and second conductors 29, 32 of the composed laminated piezoelectric element 60 are bonded respectively, and they are connected to a control circuit. The control circuit is same as shown in FIG. 1. Same elements are identified with same reference numerals and their description is omitted. In this configuration, in the piezoelectric element 26 of first layer and piezoelectric element 27 of second layer, same position control voltage Q1 and polarization recovery voltage Q2 as in the piezoelectric element 1 shown in FIG. 1 can be applied, and the position control operation and polarization recovery operation can be executed.

In this exemplary embodiment, the position control voltage Q1 and polarization recovery voltage Q2 are changed over by the switch circuit 8, but the invention is not limited to this operation. For example, by installing a superposing circuit for superposing the polarization recovery voltage Q2 on the position control voltage Q1, the voltage superposed by the superposing circuit may be applied to the piezoelectric element. Further, if the superposed voltage exceeds a predetermined voltage, it may be limited to the set voltage in the limiting circuit 12, and applied to the piezoelectric element 1. Or, the polarization recovery voltage Q2 may be applied when the position control voltage Q1 is not applied and when the piezoelectric element 1 is not operated.

Second Exemplary Embodiment

Figure 5:
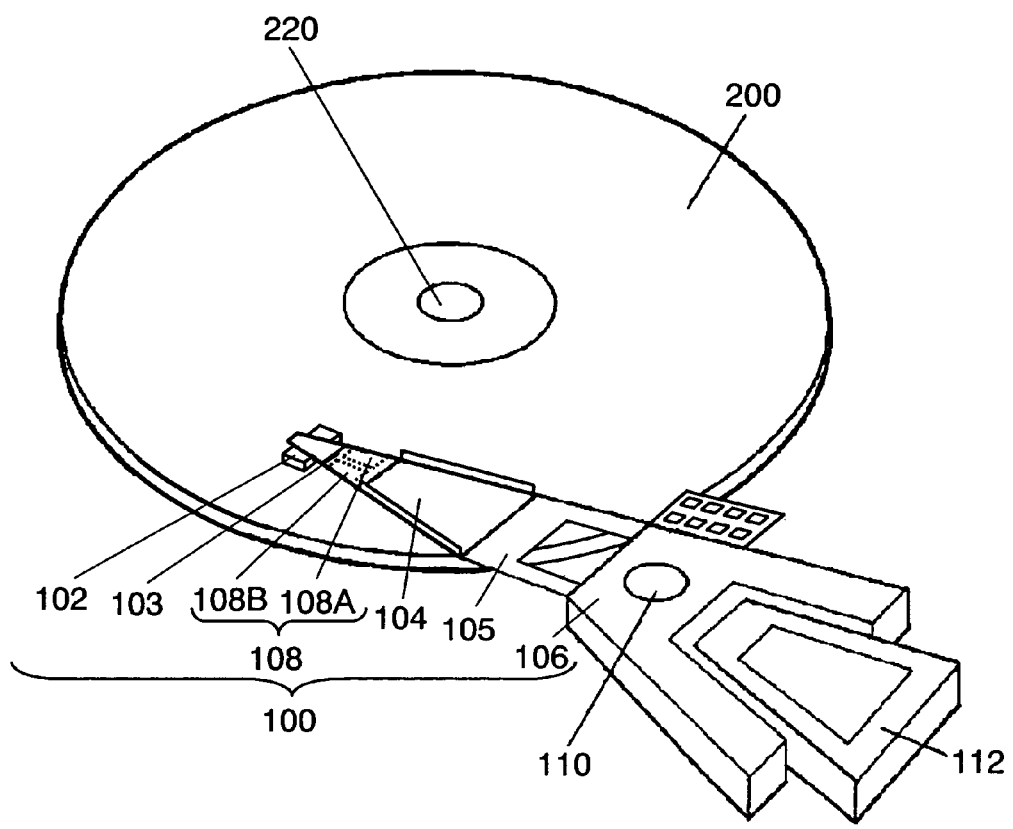
FIG. 5 is a perspective view of principal parts showing an example of impression of piezoelectric actuator in a second exemplary embodiment of the invention, and a head support mechanism mounting this piezoelectric actuator, in a disk apparatus.

FIG. 5 is a perspective view of principal parts showing an example of impression of piezoelectric actuator in a second exemplary embodiment of the invention, and a head support mechanism mounting this piezoelectric actuator, in a disk apparatus. This disk apparatus is characterized as being composed of two actuators, that is, the actuator of the conventional VCM and the piezoelectric actuator of the invention.

A head support mechanism 100 is composed of a suspension 104 of relatively low rigidity, a plate spring 105, an arm 106 of relatively high rigidity, a flexure 103, a head slider 102 disposed on the flexure 103 on a side facing a disk 200, a head (not shown) mounted on the head slider 102, and a piezoelectric element 108 adhered and fixed on the flexure 103. One end of the flexure 103 is fixed to the suspension 104. The suspension 104 is designed at a relatively low rigidity, and other end composes the plate spring 105, and this plate spring 105 is fixed to the arm 106. Further, the arm 106 is rotatably supported by a bearing 110. A VCM is composed of a voice coil 112 attached to the arm 106 and a magnet not shown. The head support mechanism 100 can rotate in a desired angle range in a direction parallel to the side of the disk 200 by means of this VCM.

Further, the piezoelectric element 108 is driven for positioning the head mounted on the head slider 102 at high precision on a desired track position of the disk 200. This head support mechanism 100 is composed of two actuators so as to be positioned roughly by the VCM, and adjusted finely by the piezoelectric actuator including the piezoelectric element 108.

The operation of the disk apparatus is explained. The disk 200 is rotated at a specified speed by rotary driving means 220. When recording or reproducing the disk apparatus, the head slider 102 flys at a certain flying height by the balance of buoyancy of air stream caused by rotation of the disk 200 and the thrusting force of thrusting the head slider 102 to the side of the disk 200, and the head records and reproduces in this specific flying state. The thrusting force of thrusting the head slider 102 to the side of the disk 200 is mainly applied by the plate spring 105 of the head support mechanism 100.

Recording or reproducing is executed in such flying state, and to position the head on a desired track position, the arm 106 rotated about the bearing 110 by means of the VCM. In a conventional disk apparatus, it is adjusted only by such positioning mechanism, but it is designed to adjust finely at very high precision by the piezoelectric element 108 in order to record at higher density.

Figure 6A:
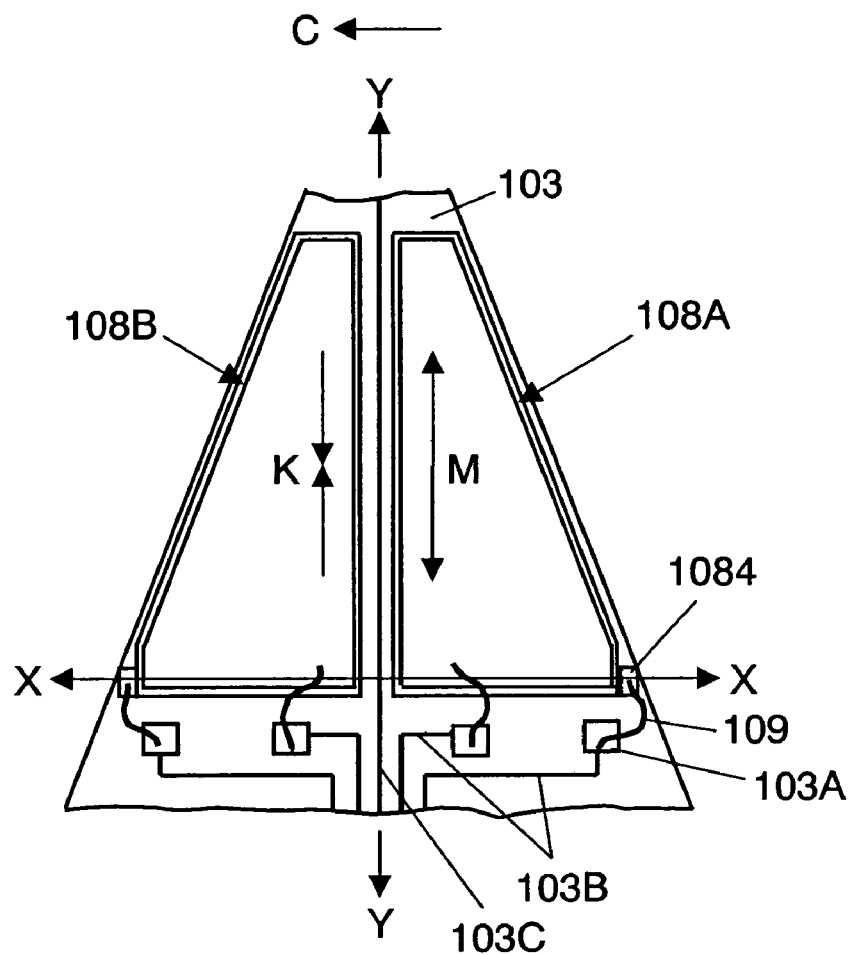
FIG. 6A is a plan view near the piezoelectric element of the piezoelectric actuator of the second exemplary embodiment.
Figure 6B:
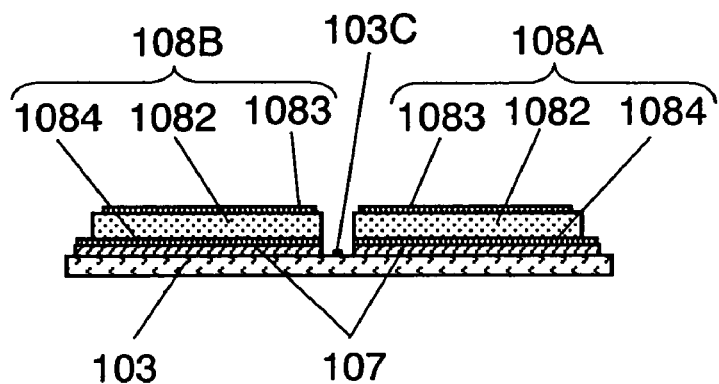
FIG. 6B is a sectional view along line X—X of the same piezoelectric element.

FIG. 6A is a plan view near the piezoelectric element 108. FIG. 6B is a sectional view along line X—X shown in FIG. 6A. On the flexure 103, a pair of piezoelectric elements 108A, 108B are adhered and fixed by means of an adhesive layer 107 at symmetrical positions to the central line Y—Y in the longitudinal direction of the suspension 104. The individual piezoelectric elements 108A, 108B are mirror-symmetrical to the line Y—Y, that is, the plane orthogonal to the same plane disposing the piezoelectric elements 108A, 108B, and are identical in their sectional structure.

That is, the first conductor 1083 and second conductor 1084 are formed so as to enclose the piezoelectric thin film 1082, and the piezoelectric elements 108A, 108B are composed of them respectively. Meanwhile, an insulating protective resin film may be also formed on the surface of these piezoelectric elements 108A, 108B. The first conductor 1083 and second conductor 1084 of the piezoelectric elements 108A, 108B respectively are connected by an electrode pad 103A of the flexure 103 and a wire lead 109. From the electrode pad 103A, a piezoelectric electrode wiring 103B connected to a control circuit (not shown) for driving the piezoelectric elements 108A, 108B provided in the disk apparatus is formed on the flexure 103. A head electrode wiring 103C for connecting a head (not shown) mounted on the head slider 102 and a control unit (not shown) of the disk apparatus is formed on the flexure 103 in the center of the pair of piezoelectric elements 108A, 108B. A control circuit may be formed together with or separately from a circuit for controlling the disk apparatus.

For fine adjustment of the head (not shown) on a specified track position at high precision, the procedure is as follows. As shown in FIG. 6A, a voltage is applied to the piezoelectric elements 108A, 108B, for example, so that one piezoelectric element 108A may be distorted in direction of arrow M, while other piezoelectric element 108B may be distorted in direction of arrow K. As a result, as combination of displacements of the piezoelectric elements 108A, 108B, the head can be distorted in direction C. To distort the head in reverse direction of arrow C, a reverse voltage of the case above is applied to the piezoelectric elements 108A, 108B. As a result, if the track pitch is narrowed in order to enhance the recording density of the disk 200, positioning at high precision and high speed is realized by using this piezoelectric element 108.

Figure 7:
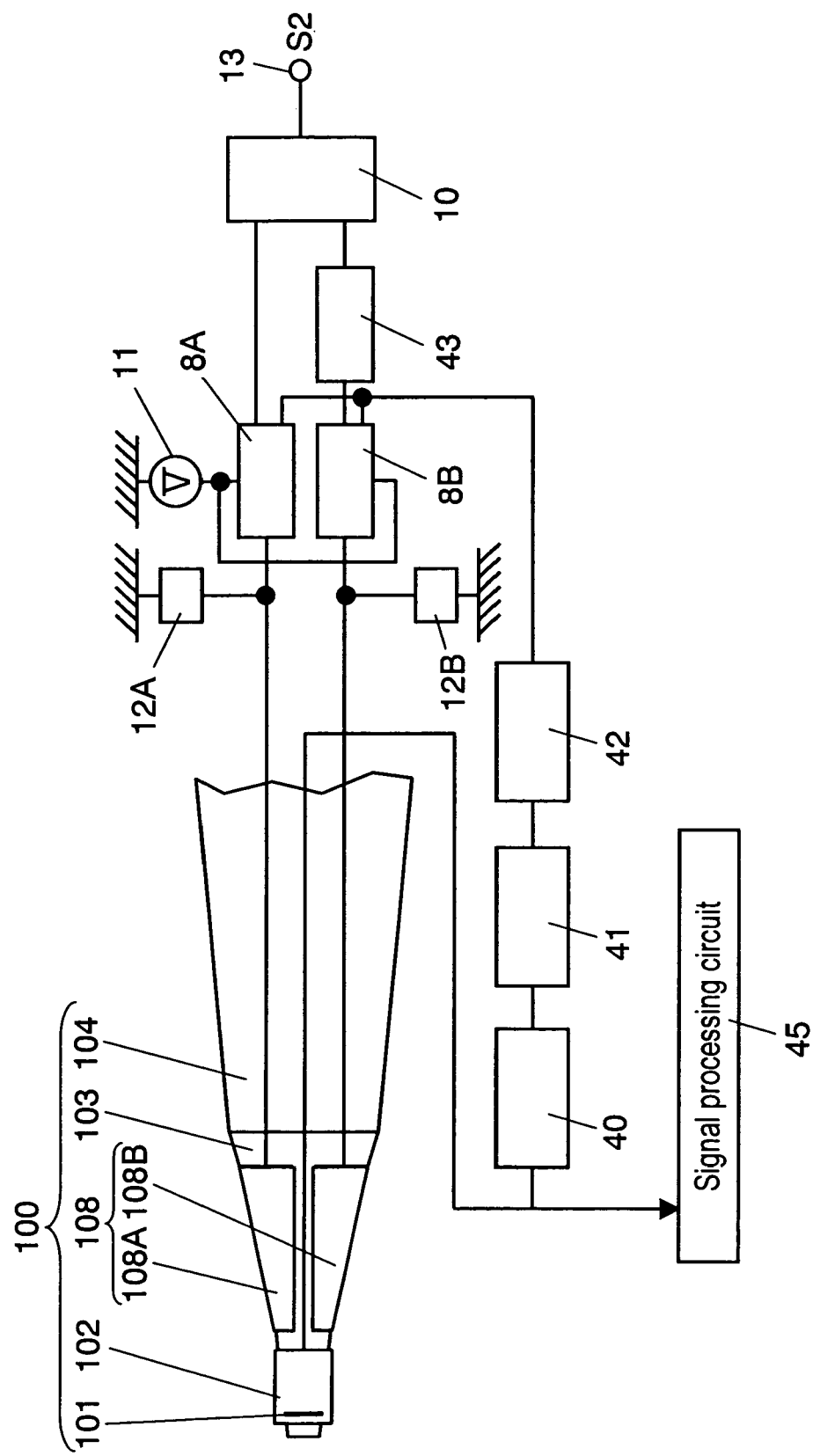
FIG. 7 is a driving circuit block diagram for driving the piezoelectric actuator of the second exemplary embodiment.

Control method of the piezoelectric actuator is explained by referring to FIG. 7. FIG. 7 is a driving circuit block diagram for driving the piezoelectric actuator 108. Servo signal recorded in the disk 200 is detected by the head 101, and amplified by a signal amplifier 40. This signal is put into a level detecting circuit 41 as detecting means, and the difference of output levels is compared, and the changing amount of displacement in time course is judged. That is, it is intended to determine the difference between the output level when the head 101 is in the center of the track of the disk 200, and the output level when deviated from the central position of the track by applying a specific voltage to the piezoelectric elements 108A, 108B. From this difference of output levels, if it is judged to be lower than a preset level difference, a switch signal is generated from a switch signal generator 42, and is put into the switch circuits 8A, 8B. By this switch signal, polarization recovery voltage Q2 is supplied for a specific time into the piezoelectric elements 108A, 108B from the switch circuits 8A, 8B. The signal detected by the head 101 is also sent into a signal processing circuit 45 of the disk apparatus, and thereby servo signal and data are read.

On the other hand, for positioning of the head 101, position control signal S2 entered from an input terminal 13 is amplified by a position control voltage circuit 10. In the piezoelectric element 108A, position control voltage Q1 amplified through the switch circuit 8A is applied, and in the other piezoelectric element 108B, inverted voltage −Q1 entered in a phase inverting circuit 43 is applied by way of the switch circuit 8B. The limiting circuits 12A, 12B limit the maximum voltage of the polarization recovery voltage Q2 so as to be a specific level to the coercive field, for example coercive field $E_{c2}$. Thus, the control circuit of the piezoelectric actuator is composed.

The operation of the piezoelectric actuator is explained below. In normal operation, the head 101 is positioned near a specified track position of the disk 200 by the VCM, and the position control signal S2 entered from the input terminal 13 is amplified in the position control voltage circuit 10, and the voltage is directly applied to the piezoelectric element 108A, while an inverted voltage is applied to the other piezoelectric element 108B. By this voltage, the piezoelectric elements 108A, 108B operate as mentioned above, and the head 101 is positioned at high precision at desired track position.

Change of standing of displacement of the piezoelectric elements 108A, 108B are detected as follows. When reading the servo signal recorded in the track by the head, the output level when the head is in the track center position and the output level when the head is deviated from the track head position by impression of a certain position control voltage Q1 are detected by the level detecting circuit 41. Output of servo signal shows the maximum output level when the head 101 is positioned in the center of the track of the disk 200. In this state, when a certain position control voltage Q1 is applied to the piezoelectric elements 108A, 108B, the head 101 is deviated from the track center, and the output is lowered as compared with the maximum output level. The difference of output level changing along with the move of the head 101 is detected by the level detecting circuit 41. Thus, the position of the head 101 is detected by using the servo signal recorded in the disk 200, and the relation between the position control voltage Q1 for position control and the displacement of the position of the head 101 can be determined.

For example, due to aging and deterioration of the piezoelectric element 108, if the displacement is decreased, even when a specific position control voltage Q1 is applied to the piezoelectric element 108, deviation from the track center is small. Therefore, when the position control voltage Q1 is applied to be distorted, the difference between the output level and maximum output level is small. Such output level difference is determined in the level detecting circuit 41 shown in FIG. 7. When the output level difference is judged to be lower than the preset level, a switch signal is put into the switch circuits 8A, 8B by means of switch signal generator 42. When the switch signal is entered, on the basis of this signal information, the polarization recovery voltage Q2 is applied to the piezoelectric elements 108A, 108B for a preset time. By impression of the polarization recovery voltage Q2, the polarization of the piezoelectric elements 108A, 108B is restored almost to the initial state, and therefore the displacement is issued nearly same as in the initial displacement. Since the polarization recovery voltage Q2 can be applied also during operation of the disk apparatus, the piezoelectric actuator and disk apparatus of very high reliability can be realized.

In the piezoelectric actuator of the exemplary embodiment, the polarization recovery voltage Q2 is applied by adjusting that the output level difference is decreased to a preset level, but the invention is not limited to such operation alone. For example, the polarization recovery voltage Q2 may be applied in every 60 minutes. Even in such impression of polarization voltage, the initial polarization state can be restored securely, and fluctuations of displacement can be substantially decreased.

This exemplary embodiment refers to a one-layer piezoelectric element, but as explained in the modified example of the first exemplary embodiment, same configuration and driving method can be applied also in the laminated piezoelectric element composed of plural layers of piezoelectric elements.

In this exemplary embodiment, from the servo signal of the disk, the output level when the head is at the track center position and the output level when moved slightly by applying a specific position control voltage Q1 are detected by the level detecting circuit 41, but it is not limited to the servo signal alone.

Third Exemplary Embodiment

A third exemplary embodiment explains a structure of piezoelectric element used in the piezoelectric actuator, and results of driving method not applying polarization recovery voltage by using this structure, by referring to an example of piezoelectric element of a single-layer structure.

The piezoelectric element of this exemplary embodiment was fabricated as follows. A first conductor 3 is a platinum (Pt) film of 100 nm in film thickness, and a piezoelectric thin film 2 is a lead zirconic titanate (PZT) thin film of 3 μm in film thickness fabricated by sputtering method. First, on a magnesium oxide (MgO) single crystal substrate having (100) azimuth, a 100 nm thick Pt film is formed in (100) orientation at 600° C. In succession, a 3 μm thick PZT film is formed in (001) orientation at 600° C. As a second conductor 4, a Pt film is formed in a film thickness of 100 nm at room temperature. Then, by processing into a specified piezoelectric shape by etching, the MgO substrate is removed by further etching, and a piezoelectric element 1 as shown in FIG. 1 is fabricated.

The obtained PZT thin film was measured by X-ray diffraction. As a result, the crystal structure was confirmed to be perovskite structure. On the basis of this diffraction profile, as a result of Rietbeld refinements, more than 90% of PZT thin film was (001) oriented, that is, it is confirmed that the c-axis is directed in the vertical direction to the film surface in perovskite crystal structure.

When fabricating a laminated piezoelectric element 60 shown in FIG. 4, first conductors 28, 31, piezoelectric thin films 30, 33, and second conductors 29, 32 are laminated and formed on two MgO substrates, and they are adhered with an adhesive layer 50, and one MgO substrate is removed by etching. When one MgO substrate is removed by etching, a thin film structure laminated on the adhesive layer 50 is exposed on the other MgO substrate. This thin film structure is processed by photolithography and etching, and a pattern as shown in FIG. 4 is formed, and the other MgO substrate is removed by etching, so that a laminated piezoelectric element 60 as shown in FIG. 4 is obtained.

Figure 8A:
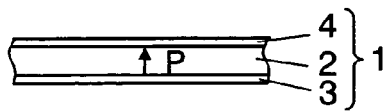
FIG. 8A is a sectional view of piezoelectric element 1 in a third exemplary embodiment of the invention.
Figure 8B:
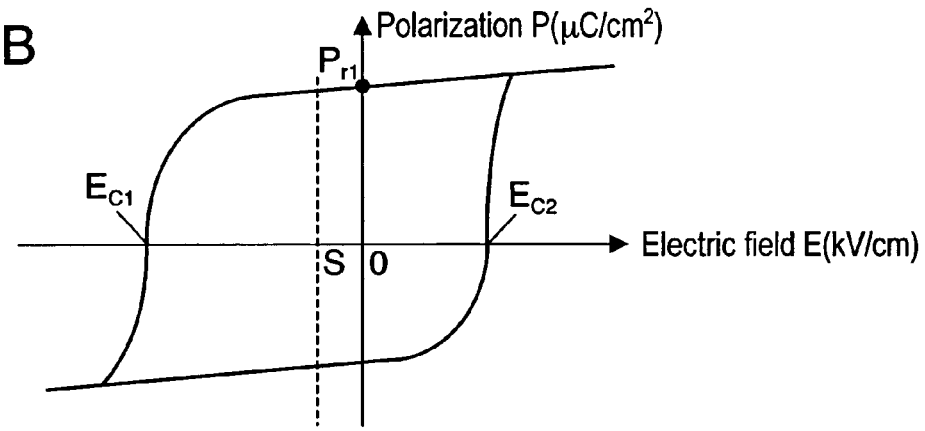
FIG. 8B is a P-E hysteresis characteristic diagram of the same piezoelectric element.

FIG. 8B shows a P-E hysteresis characteristic of the piezoelectric element 1 formed in this manner. The axis of abscissas denotes the electric field (E) and the axis of ordinates represents the polarization (P). FIG. 8A is a sectional view of the piezoelectric element 1 shown in FIG. 1, in which symbol P denotes the direction of polarization. The piezoelectric element 1 of the exemplary embodiment is polarized from the first conductor 3 to the direction of the second conductor 4. The negative coercive field $E_{c1}$ as one of the intersections of the hysteresis curve with the axis of abscissas (electric field axis) is in reverse direction as the electric field of the polarization direction P, and is about −140 kV/cm. The positive coercive field $E_{c2}$ as other intersection is in same direction as the electric field of the polarization direction P, and is about 80 kV/cm. As known from this relation, the piezoelectric element 1 of the exemplary embodiment is polarized in the smaller absolute value of the coercive field, that is, in the same direction as the positive coercive field $E_{c2}$. $P_{r1}$ is remanent polarization.

As described herein, the piezoelectric thin film 2 thus fabricated is spontaneously polarized without requiring poling process, and an asymmetrical hysteresis characteristic is obtained.

Or, if sufficient polarization characteristic is not obtained in this film forming method, the piezoelectric body may be polarized by poling process. Further, the film forming method may be also realized by laser ablation method of sol-gel method.

Figure 8C:
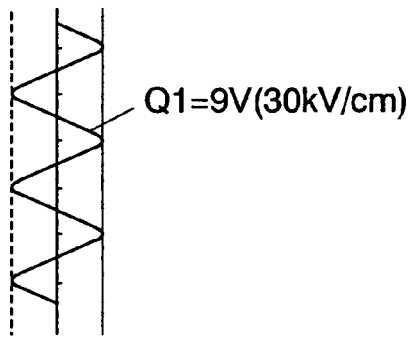
FIG. 8C is a voltage waveform diagram of position control voltage in driving condition 1 of the invention applied to the same piezoelectric element.
Figure 8D:
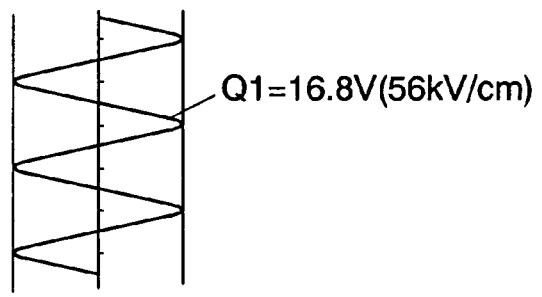
FIG. 8D is a voltage waveform diagram of position control voltage in driving condition 2 of the invention applied to the same piezoelectric element.
Figure 8E:
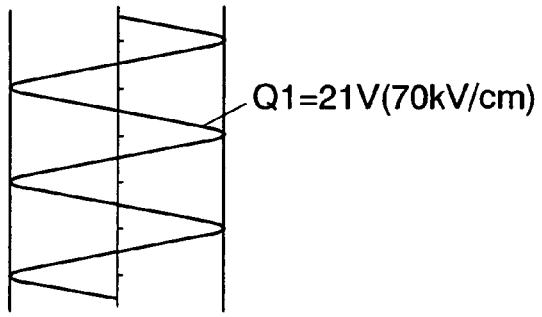
FIG. 8E is a voltage waveform diagram of position control voltage in comparative driving condition 1 applied to the same piezoelectric element.

The following is the explanation about the changing characteristic of deterioration of displacement by the voltage when position control voltage Q1 is applied to the prepared piezoelectric element 1. In the direction of polarization shown in FIG. 8A, in the case of the piezoelectric element 1 having an asymmetric hysteresis characteristic as shown in FIG. 8B, in particular, the electric field in the negative direction to deteriorate polarization is important. FIG. 8C, FIG. 8D, and FIG. 8E show voltage waveform diagrams in the case of impression of different position control voltages Q1 to the piezoelectric element 1.

In FIG. 8C, position control voltage Q1 is Q1=9 V, electric field is 30 kV/cm, and on the basis of the middle point S of negative coercive field $E_{c1}$ and positive coercive field $E_{c2}$, the driving condition is biased by 30 kV/cm to the positive coercive field $E_{c2}$ side. This is called driving condition 1 of the invention.

In FIG. 8D, Q1=16.8 V, electric field is 56 kV/cm, and it is a value of 0.4 times of negative coercive field $E_{c1}$. This is called driving condition 2 of the invention.

In FIG. 8E, Q1=21 V, electric field is 70 kV/cm, and it is a value of 0.5 times of negative coercive field $E_{c1}$. This is called comparative driving condition 1. In all cases, frequency was 1 kHz, and sinusoidal waves were simply applied.

Figure 9A:
FIG. 9A is a sectional view of piezoelectric element 50 of comparative example of the third exemplary embodiment.
Figure 9B:
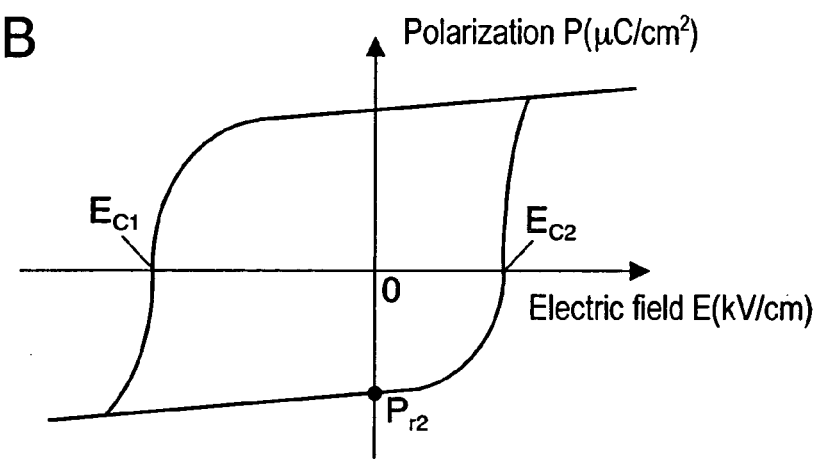
FIG. 9B is a P-E hysteresis characteristic diagram of the same piezoelectric element.
Figure 9C:
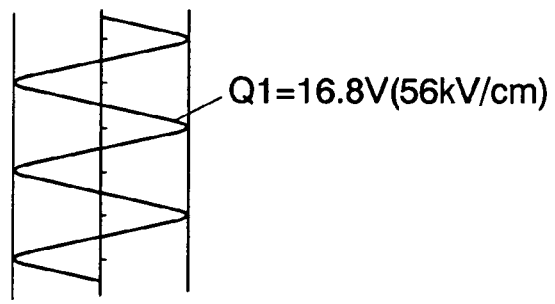
FIG. 9C is a voltage waveform diagram of position control voltage in comparative element A driving condition 1 applied to the same piezoelectric element.

Further, by way of comparison, the piezoelectric elements shown in FIG. 9A, FIG. 9B, and FIG. 9C were similarly evaluated the reliability. As known from FIG. 9A and FIG. 9B, the piezoelectric element 50 has the direction of polarization P in reverse direction to the piezoelectric element 1 in FIG. 8, and the hysteresis characteristic is the same. In this piezoelectric element 50, similarly, sinusoidal position control voltage Q1 at frequency of 1 kHz was applied. At this time, position control voltage Q1 is Q1=16.8 V, electric field is 56 kV/cm. This is called comparative element A driving condition 1. In these examples of impression of position control voltage Q1, deterioration of displacement due to deterioration of polarization is mainly due to the effect of voltage applied to the negative coercive field $E_{c1}$ side in the piezoelectric element 1 shown in FIG. 8A, and mainly due to the effect of voltage applied to the positive coercive field $E_{c2}$ side in the piezoelectric element 50 shown in FIG. 9A.

Table 1 shows deterioration of displacement by impression of position control voltage Q1 for 1000 hours in the specified driving conditions.

TABLE 1

| Driving condition | Q1 Top: V Bottom: kV/cm | Q1/$E_{c1}$ | Displacement deterioration in 1000 hours (%) | Remarks |
|---|---|---|---|---|
| Driving condition 1 of the invention | ±9 ±30 | 0.21 | 1 | |
| Driving condition 2 of the invention | ±16.8 ±56 | 0.4 | 3 | |
| Comparative driving condition 1 | ±21 ±70 | 0.5 | 10 | |
| Comparative element A driving condition 1 | ±16.8 ±56 | 0.4 | 25 | Q1/$E_{c2}$ = 0.7 |

As known from Table 1, when the direction of polarization P shown in FIG. 8A is same as the direction of positive coercive field $E_{c2}$, and position control voltage Q1 is a voltage equivalent to 0.4 times or less of the negative coercive field $E_{c1}$, the displacement deterioration in 1000 hours is 1% to 3%, and is very small. In driving condition 1 of the invention, in particular, the displacement deterioration was 1%. Fluctuations of displacement of driving condition 1 of the invention were measured further for 5000 hours, but the displacement change was within 1% in 5000 hours.

The reason of obtaining such stable displacement is explained. As known from FIG. 8B, the value of the middle point S of positive coercive field $E_{c2}$ and negative coercive field $E_{c1}$ is −30 kV/cm in the piezoelectric element 1 in driving condition 1 of the invention. Therefore, in the case of position control voltage Q1 in FIG. 8C, the position control voltage Q1 applied to the negative coercive field $E_{c1}$ side is only a voltage smaller than the voltage of the middle point S. As compared with the conventional piezoelectric element having symmetrical hysteresis characteristic, in the case of the piezoelectric element 1 in driving condition 1 of the invention, apparently, it is driven by a voltage applied to the positive coercive field $E_{c2}$ side. In the direction of positive coercive field $E_{c2}$, if a voltage greater than the positive coercive field $E_{c2}$ is applied, it is the direction of recovery of polarization, and displacement deterioration does not take place. Thus, apparently, since the position control voltage Q1 is driven by the voltage applied to the positive coercive field $E_{c2}$ side, and polarization is not disturbed, and changes of displacement are suppressed. Therefore, in the direction of negative coercive field $E_{c1}$, as far as a voltage corresponding to the range of middle value S and electric field zero point 0 is applied, changes of displacement can be suppressed sufficiently. In the case of driving condition 1 of the invention, since the film thickness of the piezoelectric thin film 2 is 3 µm, a voltage from 0 V to −9 V corresponds to such stable voltage range. When a voltage of −9 V is applied, a displacement is 0.36 µm, and it is sufficiently practicable. In this direction of positive coercive field $E_{c2}$, a voltage more than the positive coercive field $E_{c2}$ may be applied, and a total displacement of about 1 µm can be obtained. As far as the position control voltage Q1 is applied within this voltage range, it is not necessary to apply polarization recovery voltage Q2.

In the case of driving condition 2 of the invention in FIG. 8D, a voltage mainly leading to deterioration of polarization in position control voltage Q1 is a voltage applied to the negative coercive field $E_{c1}$ side, and it is −16.8 V at maximum. When expressed by the ratio of position control voltage Q1 and negative coercive field $E_{c1}$, it is $Q1/E_{c1}=0.4$.

By contrast, in comparative driving condition 1, displacement deterioration in 1000 hours was 10%, which is not practicable. Considering from these results, in the piezoelectric element 1 of the exemplary embodiment, it is known that the displacement deterioration is mainly due to the ratio of the maximum value of position control voltage Q1 applied in the negative direction and the negative coercive field $E_{c1}$.

In a range of $Q1/E_{c1}=0.4$ to 0.5, aging deterioration of displacement tends to increase significantly, surpassing the practicable allowable value of 5% in the absence of polarization recovery process at $Q1/E_{c1}$=approx. 0.43. However, this value ($Q1/E_{c1}$=approx. 0.43) is hardly allowable considering thickness fluctuations of piezoelectric thin film, and to assure the practicable allowable value of 5% securely, it is required to set at $Q1/E_{c1} \leq 0.4$. As known from these results, it is preferred to set the position control voltage Q1 at $Q1/E_{c1} \leq 0.4$ in the piezoelectric element 1 having the direction of polarization P as shown in FIG. 8A and an asymmetrical hysteresis characteristic of a larger absolute value of negative coercive field $E_{c1}$ than positive coercive field $E_{c2}$. In this condition, if polarization recovery is not processed, a further larger voltage can be applied when polarization recovery process.

In comparative element A driving condition 1, on the other hand, displacement deterioration in 1000 hours was 25%, and a relatively large deterioration was found. This is because the direction of polarization is reverse, and in this piezoelectric element 50, when the ratio is calculated with the positive coercive field $E_{c2}$ having effects on polarization deterioration, a large value of $Q1/E_{c2}=0.7$ is obtained.

Fourth exemplary embodiment

In a fourth exemplary embodiment of the invention, using the piezoelectric element 1 fabricated in the manufacturing method of the third exemplary embodiment, and a piezoelectric element 50 inverted in the direction of polarization from the piezoelectric element 1 and a piezoelectric element 55 having a symmetrical hysteresis characteristic, a driving method is studied by applying a polarization recovery voltage.

In the fourth exemplary embodiment, using these piezoelectric elements, by a driving method of applying a bias voltage to position control voltage Q1, and a driving method of applying polarization recovery voltage Q2, fluctuations of displacement, and changes of insulation resistance in the atmosphere of high temperature and high humidity were studied.

Figure 10A:
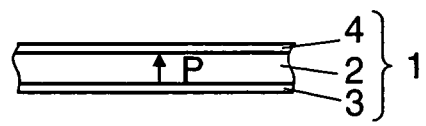
FIG. 10A is a sectional view of piezoelectric element 1 in a fourth exemplary embodiment of the invention.
Figure 10B:
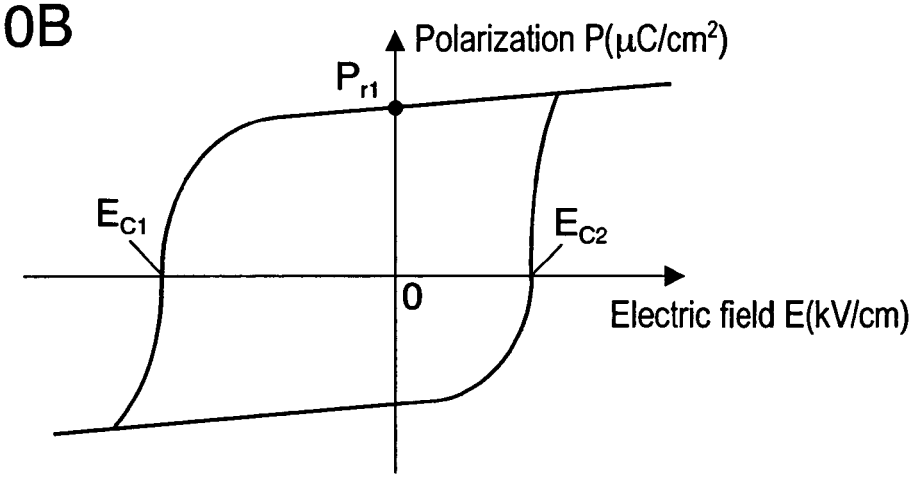
FIG. 10B is a P-E hysteresis characteristic diagram of the same piezoelectric element.

The piezoelectric element 1 was manufactured in the same condition as in the third exemplary embodiment, and negative coercive field $E_{c1}$ is −140 kV/cm, positive coercive field $E_{c2}$ is +80 kV/cm, and direction of polarization P is same as direction of positive coercive field $E_{c2}$. These conditions are shown in FIG. 10A and FIG. 10B, which are same as FIG. 8A and FIG. 8B.

Figure 11A:
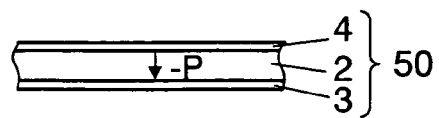
FIG. 11A is a sectional view of piezoelectric element 50 of comparative example of the fourth exemplary embodiment.
Figure 11B:
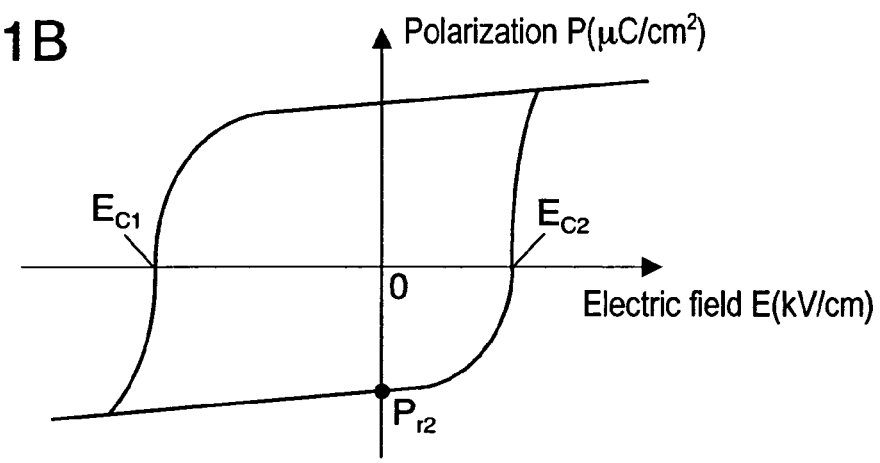
FIG. 11B is a P-E hysteresis characteristic diagram of the same piezoelectric element.

The piezoelectric element 50 is same as the piezoelectric element 1 in negative coercive field $E_{c1}$ and positive coercive field $E_{c2}$, but direction of polarization P is same as direction of negative coercive field $E_{c1}$. These conditions are shown in FIG. 11A and FIG. 11B, which are same as FIG. 9A and FIG. 9B. The piezoelectric element 50 was manufactured same as the piezoelectric element 1, and then polarized in reverse direction.

Figure 12A:
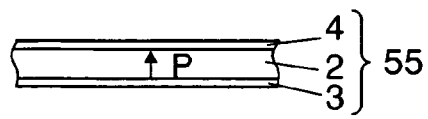
FIG. 12A is a sectional view of piezoelectric element 55 of comparative example of the fourth exemplary embodiment.
Figure 12B:
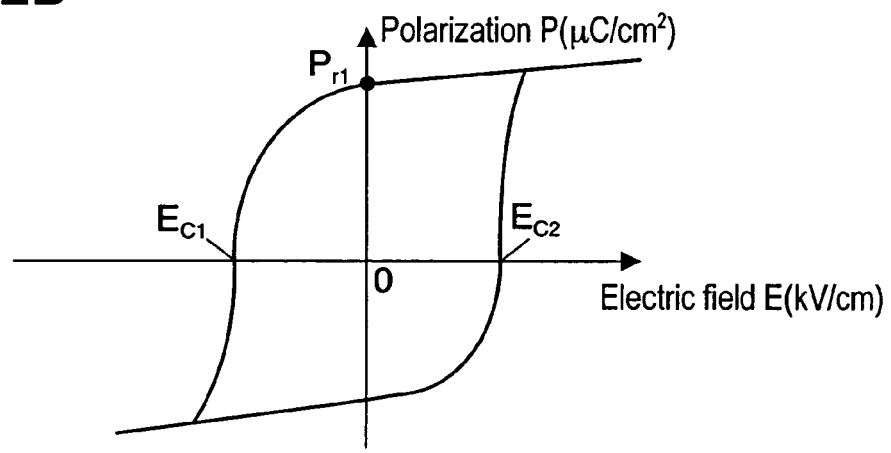
FIG. 12B is a P-E hysteresis characteristic diagram of the same piezoelectric element.

The piezoelectric element 55 is nearly same in absolute values as in negative coercive field $E_{c1}$ and positive coercive field $E_{c2}$ as shown in FIG. 12A and FIG. 12B, having a symmetrical hysteresis characteristic, and direction of polarization P is same as direction of positive coercive field $E_{c2}$. The piezoelectric element 55 was manufactured same as the piezoelectric element 1, and then annealed to have a symmetrical hysteresis characteristic and a coercive field of 80 kV/cm.

Using these three piezoelectric elements 1, 50, 55, displacement deterioration were evaluated in the driving method of applying position control voltage Q1 superposed with bias voltage and the driving method of applying polarization recovery voltage Q2.

Figure 10C:
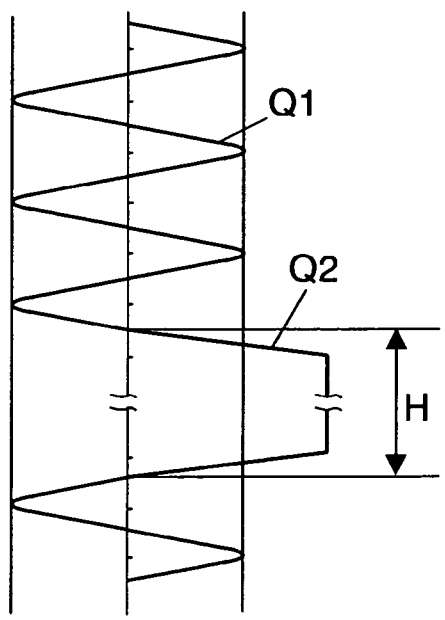
FIG. 10C is a combined waveform diagram of position control voltage and polarization recovery voltage in driving condition 3 of the invention applied to the same piezoelectric element.
Figure 14:
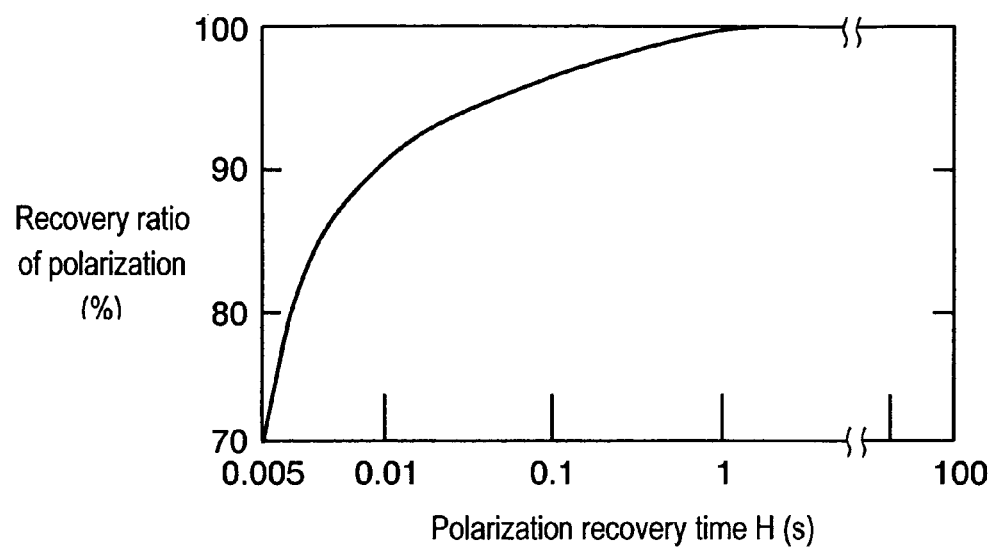
FIG. 14 is a diagram showing results of polarization recovery effect by polarization recovery time in driving method in driving condition 3 of the invention in the fourth exemplary embodiment.

In driving condition 3 of the invention, using the piezoelectric element 1 as shown in FIG. 10C, sinusoidal wave of 1 kHz is applied at Q1=±21 V (±70 kV/cm) as position control voltage Q1 same as in the third exemplary embodiment, while polarization recovery voltage Q2 is applied for 1 second in every 60 minutes in the same direction as polarization P. The polarization recovery voltage Q2 is about 1.5 times of positive coercive field $E_{c2}$. Polarization recovery time H is 1 second according to the result of experiment mentioned below (FIG. 14).

Comparative driving condition 1 is the driving condition using the piezoelectric element 1 as shown in FIG. 8E, which is exactly the same as the driving condition of the first exemplary embodiment using the piezoelectric element 1.

Figure 11C:
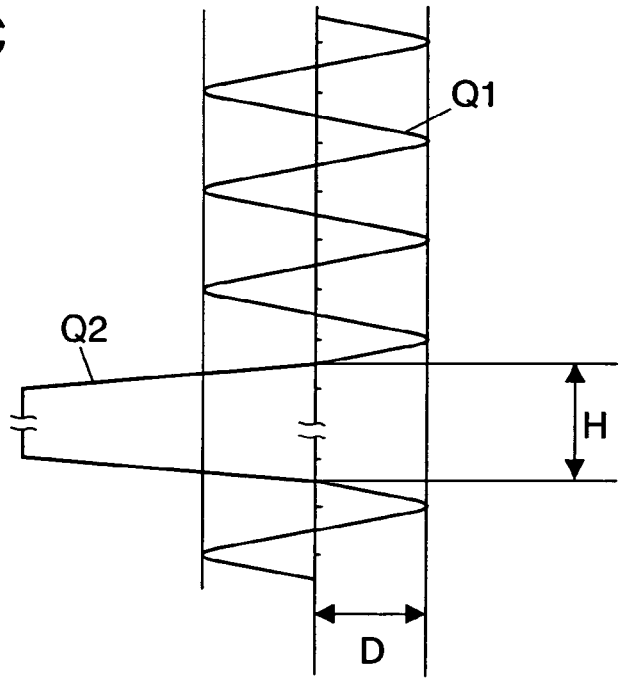
FIG. 11C is a combined waveform diagram of position control voltage and polarization recovery voltage in comparative element A driving condition 2 applied to the same piezoelectric element.

Comparative element A driving condition 2 is a driving method of applying position control voltage Q1 and polarization recovery voltage Q2 as shown in FIG. 11C, using the piezoelectric element 50 shown in FIG. 11A and FIG. 11B. In this case, position control voltage Q1 is sinusoidal wave of 1 kHz, at Q1=±21 V (±70 kV/cm), and polarization recovery voltage Q2 is about 1.5 times of negative coercive field $E_{c1}$. Polarization recovery time H is similarly 1 second.

Figure 12C:
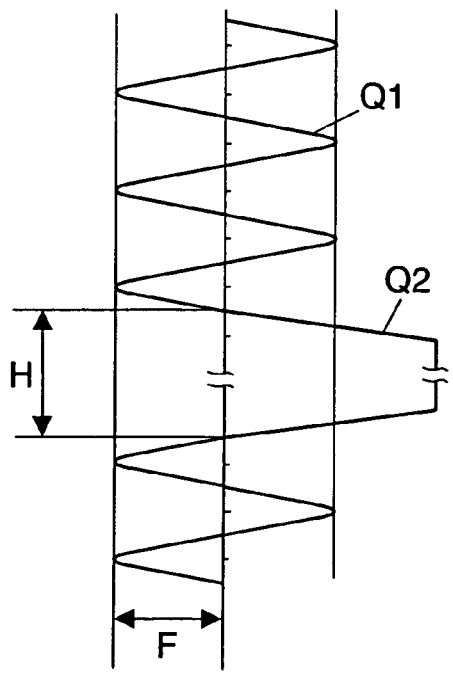
FIG. 12C is a combined waveform diagram of position control voltage and polarization recovery voltage in comparative element B driving condition applied to the same piezoelectric element.

Comparative element B driving condition is a driving method of applying position control voltage Q1 and polarization recovery voltage Q2 as shown in FIG. 12C, using the piezoelectric element 55 shown in FIG. 12A and FIG. 12B.

This driving condition is same as driving condition 3 of the invention shown in FIG. 10C.

Figure 13A:
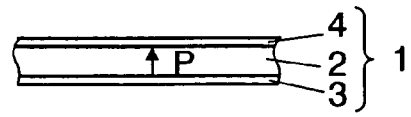
FIG. 13A is a sectional view of piezoelectric element 1 of the fourth exemplary embodiment.
Figure 13B:
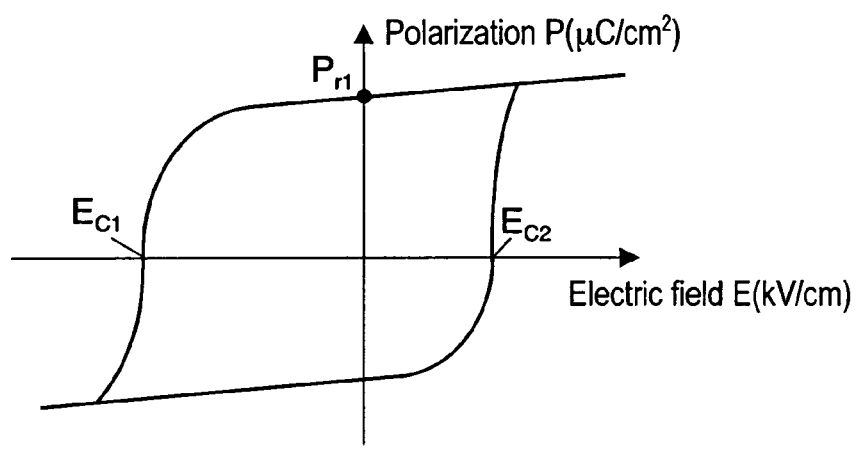
FIG. 13B is a P-E hysteresis characteristic diagram of the same piezoelectric element.
Figure 13C:
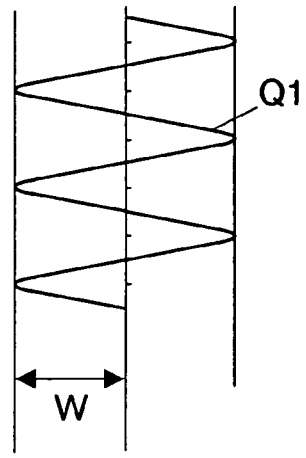
FIG. 13C is a waveform diagram of position control voltage with a superposed bias voltage in comparative driving condition 2 applied to the same piezoelectric element.

Comparative driving condition 2 is a driving method of using the piezoelectric element 1 shown in FIG. 13A and FIG. 13B, and applying sinusoidal wave of 1 kHz, at Q1=±21 V (±70 kV/cm) same as in comparative driving condition 1, and further superposing a DC bias voltage W of +21 V (+70 kV/cm) as position control voltage Q1 as shown in FIG. 13C. Therefore, in this driving condition, electric field in reverse direction so as to deteriorate the direction of polarization P is not applied to the piezoelectric element 1.

In these impressions of position control voltage Q1, deterioration of polarization is mainly caused by the voltage applied to the coercive field side of reverse direction of direction of polarization.

In these five driving conditions, degrees of displacement deterioration due to time-course changes were investigated, and the polarization recovery effect by the polarization recovery time H is explained in the first place. FIG. 14 is a diagram showing results of polarization recovery effect by polarization recovery time H in driving method in driving condition 3 of the invention. In FIG. 14, polarization recovery time H is the impression time of specified polarization recovery voltage Q2. Recovery ratio of polarization is the percentage of recovery of polarization deterioration by impression of polarization recovery voltage Q2 from the state of polarization deterioration by impression of position control voltage Q1 as shown in FIG. 10C for 60 minutes. For example, suppose to be deteriorated by 30% from the initial state by impression of position control voltage Q1 for 60 minutes, if recovered by 90% by impression of polarization recovery voltage Q2, deterioration is suppressed to 3% of the initial state. The polarization recovery voltage Q2 is about 1.5 times of positive coercive field $E_{c2}$, that is, Q2=+36 V (+120 kV/cm), and the recovery rate of polarization was measured by varying the polarization recovery time H.

As clear from FIG. 14, it is recovered by about 90% in about 0.01 second, and about 95% in 0.1 second, and almost completely in 1 second. Practically allowable displacement deterioration is 5% or less. In the case of driving condition 3 of the invention, in 60 minutes, the displacement immediately before impression of polarization recovery voltage Q2 is about 5%, and at this level of displacement, by applying the polarization recovery voltage Q2 for about 0.01 second, the displacement is recovered by every specific time, and deterioration of displacement is not accumulated. Therefore, when applying the polarization recovery voltage Q2 intermittently, it is enough to apply for 0.01 second or more.

On the other hand, if the polarization recovery voltage Q2 is applied too long, not only the insulation resistance may deteriorate due to ion migration, but also the duration for position control is shorter, and other problems may occur. In the experiment of impression of same polarization recovery voltage Q2 in the high temperature and high humidity atmosphere of 85° C. and 85%, fluctuations of insulation resistance exceeded the allowable values if the polarization recovery time H was longer than 70 seconds. Besides, the recovery effect is saturated at about 60 seconds of polarization recovery time H, and it is not advised for apply for a long time because it may only lead to insulation breakdown or deterioration of insulation resistance. Hence, the polarization recovery time H is preferred to be in a range of 0.01 second to 60 seconds, more preferably 0.1 second to 10 seconds. In this exemplary embodiment, therefore, the polarization recovery time H of polarization recovery voltage Q2 is set at 1 second.

When ±21 V is applied in initial state, the displacement is about ±0.8 μm commonly in the piezoelectric element 1, piezoelectric element 50, or piezoelectric element 55, and is nearly same in all elements. Voltage was applied in specific conditions, and fluctuations of displacement were measured at specific time intervals. Table 2 shows displacement deterioration in 1000 hours, recording the rate of deterioration as compared with the initial state. In the driving conditions of impression of polarization recovery voltage Q2, that is, driving condition 3 of the invention, comparative element A driving condition 2, and comparative element B driving condition, the table also shows displacement immediately before and after impression of polarization recovery voltage Q2 at the time of 1 hour and 1000 hours.

TABLE 2

| | | | Item | | | |
|---|---|---|---|---|---|---|
| | | | Displacement deterioration in 1 hour (%) | | Displacement deterioration in 1000 hours (%) | |
| | Q1 | Q2 | | | | |
| Driving condition | Top: V Bottom: kV/cm | Top: V Bottom: kV/cm | Before Q2 application | After Q2 application | Before Q2 application | After Q2 application |
| Driving condition 3 of the invention | ±21 ±70 | +36 +120 | 5 | 1 | 5 | 2 |
| Comparative driving condition 1 | ±21 V ±70 | — | | 5 | | 10 |
| Comparative driving condition 2 | +21 ± 21 +70 ± 70 | — | | 1 | | 1 |
| Comparative element A driving condition 2 | ±21 ±70 | −63 −210 | 30 | 5 | 30 | 5 |

TABLE 2-continued

| | | | Displacement deterioration in 1 hour (%) | | Displacement deterioration in 1000 hours (%) | |
|---|---|---|---|---|---|---|
| | Q1 | Q2 | | | | |
| Driving condition | Top: V Bottom: kV/cm | Top: V Bottom: kV/cm | Before Q2 application | After Q2 application | Before Q2 application | After Q2 application |
| Comparative element B driving condition | ±21 ±70 | +36 +120 | 25 | 4 | 25 | 4 |

As clear from Table 2, in comparative driving condition 1, deterioration was 5% in 1 hour and 10% in 1000 hours. Practical allowable limit is 5%, and comparative driving condition 1 is far from practicable.

However, in driving condition 3 of the invention, in 1 hour, deterioration was 5% immediately before impression of polarization recovery voltage Q2, but it was improved to 1% after impression of polarization recovery voltage Q2. In 1000 hours, deterioration was also 5% immediately before impression of polarization recovery voltage Q2, and the deterioration was hardly progressed. After impression of polarization recovery voltage Q2, it was improved to 2%. That is, in driving condition 3 of the invention, deterioration could be held within a range of 2% to 5% over a long period of 1000 hours. Therefore, intermittent impression of polarization recovery voltage Q2 at every specific time interval to restore polarization was found to be very effective for preventing deterioration of displacement. In driving condition 3 of the invention, if the position control voltage Q1 is a negative maximum value, there is a sufficient allowance as compared with the negative coercive field $E_{c1}$. This ample allowance is judged to have a great effect in prevention of deterioration of polarization. Moreover, if polarization deteriorates, degree of deterioration is small, and the absolute value of the positive coercive field $E_{c2}$ is smaller than the absolute value of the negative coercive field $E_{c1}$, and therefore the polarization state is recovered nearly to the initial state by impression of polarization recovery voltage Q2.

In comparative driving condition 2, deterioration was 1% or less in 1 hour and 1000 hours, and favorable results were obtained. The reason of favorable results in this comparative driving condition 2 is that a DC bias voltage W of +21 V is applied to the position control voltage Q1, so that voltage of reverse direction is not applied to the direction of polarization.

On the other hand, in comparative element A driving condition 2, by applying polarization recovery voltage Q2, deterioration is improved to 5% of allowable limit. In the case of this driving condition, the positive maximum voltage D of position control voltage Q1 is nearly same as the positive coercive field $E_{c2}$ as shown in FIG. 11C. Since polarization is in reverse direction, when same voltage as positive coercive force $E_{c2}$ is applied, polarization is likely to be disturbed, but by impression of polarization recovery voltage, displacement deterioration is improved. However, since the absolute value of the negative coercive force $E_{c1}$ is large, a large polarization recovery voltage Q2 must be applied, and hence when recovery voltage is applied, insulation breakdown may occur momentarily, and insulation resistance is likely to deteriorate in a long period, and due caution is needed.

In comparative element B driving condition, by applying polarization recovery voltage Q2, deterioration of displacement is improved somewhat, but since deterioration before impression of polarization recovery voltage Q2 is significant, it cannot be improved to 5% or less below the allowable limit. The piezoelectric element 55 of this comparative element B driving condition has a symmetrical hysteresis characteristic, and the negative coercive field $E_{c1}$ and positive coercive field $E_{c2}$ are nearly same values. When position control voltage Q1 is applied to the piezoelectric element 55 having such characteristic, a negative maximum value F is closer to the negative coercive field $E_{c1}$ as shown in FIG. 12C, and polarization is likely to deteriorate. This deterioration of polarization is recovered by impression of polarization recovery voltage Q2. However, since fluctuations before recovery are larger than in driving condition 3 of the invention, the finally recovered displacement deterioration is a slightly larger value.

Thus, concerning the changing characteristic of displacement, driving condition 3 of the invention and comparative driving condition 2 presented very favorable results, and it is clarified that a significant improving effect is obtained by applying a polarization recovery voltage. On the other hand, in comparative element A driving condition 2 and comparative element B driving condition, deterioration was over the allowable limit before impression of polarization recovery voltage, but allowable results were obtained after impression of polarization recovery voltage. In these driving conditions, therefore, instead of applying the position control voltage Q1 for 60 minutes, it should be limited to the time until deterioration of 5%, and polarization recovery voltage Q2 should be applied.

In driving condition 3 of the invention, comparative driving condition 2, and comparative driving condition 1 relatively smaller in deterioration of displacement, fluctuations of insulation resistance were measured by applying similar voltages in the high temperature and high humidity atmosphere of 85° C. and 85%. The initial insulation resistance of the fabricated piezoelectric elements 1 was about 10 GΩ in three samples, and the point of deteriorating to 1 MΩ was defined as defective insulation, and the cumulative defective rate was determined. Results are shown in Table 3.

TABLE 3

| | Item Cumulative defective rate (%) | | | | |
|---|---|---|---|---|---|
| Driving condition | Initial | 1 hour | 10 hours | 100 hours | 1000 hours |
| Driving condition 3 of the invention | 0 | 0 | 0 | 0 | 0 |

TABLE 3-continued

| Driving condition | Item Cumulative defective rate (%) | | | | |
|---|---|---|---|---|---|
| | Initial | 1 hour | 10 hours | 100 hours | 1000 hours |
| Comparative driving condition 1 | 0 | 0 | 0 | 0 | 0 |
| Comparative driving condition 2 | 0 | 0 | 70 | 100 | 100 |

As clear from Table 3, in comparative driving condition 1 and driving condition 1 of the invention, the cumulative defective rate is 0% in 1000 hours, and favorable results were obtained. In comparative driving condition 2, the cumulative defective rate was 70% in 10 hours and 100% in 100 hours. The very large cumulative defective rate of comparative driving condition 2 is due to impression of DC bias voltage of +21 V, and ion migration is promoted and the piezoelectric thin film 2 is damaged.

In comparative element A driving condition, since the polarization recovery voltage is large, momentary insulation breakdown occurs in some samples at the time of impression of recovery voltage, and slight deterioration of insulation resistance is observed. However, in samples not having such momentary insulation breakdown, deterioration of insulation resistance was within an allowable limit.

It is known from these results that the driving method of applying polarization recovery voltage is effective for stabilization of displacement for a long period of time. Further, to obtain a stability of insulation resistance in the high temperature and high humidity atmosphere, driving condition 3 of the invention is found to be most effective driving method.

Hence, using the piezoelectric element 1 having a P-E hysteresis curve of smaller value of positive coercive field $E_{c2}$ than negative coercive field $E_{c1}$ as in driving condition 3 of the invention, by applying polarization recovery voltage Q2 in every specific time, a piezoelectric actuator operating stably for a long period can be realized.

In the exemplary embodiments, the piezoelectric element is explained as a piezoelectric element having negative coercive field of $E_{c1}=-140$ kV/cm and positive coercive field of $E_{c2}$ of 80 kV/cm, but the invention is not limited to this example. Same effects are obtained by the piezoelectric thin film having different values in negative coercive field $E_{c1}$ and positive coercive field $E_{c2}$, and having direction of polarization P in a smaller direction of absolute value of coercive field.

Thus, by applying a polarization recovery voltage Q2 at a proper timing during use of the piezoelectric actuator of the invention, the actuator is driven while restoring the polarization of the piezoelectric element almost to the initial state. In this driving method for recovery of polarization, it is intended to recover from small deterioration of polarization occurring during use of piezoelectric actuator periodically or intermittently. As compared with the conventional polarization process requiring high temperature, high electric field and long time, it is possible to recover in extremely simple conditions and in assembled state. When this piezoelectric actuator is installed, for example, in a disk apparatus, the displacement can be restored by applying the polarization recovery voltage periodically while operating as the actuator.

In the exemplary embodiments, a specific polarization recovery voltage is applied for 1 second in every 60 minutes, but the polarization recovery voltage is not limited to a specific voltage, but the polarization recovery voltage may be increased depending on fluctuations and the polarization may be restored, In the exemplary embodiments, polarization recovery voltage is applied in every specific time interval, but it is not limited to the interval. It may be varied depending on the characteristic of the piezoelectric element, or the time interval may not be constant.

In the exemplary embodiments, the position control voltage and polarization recovery voltage are changed over and applied to the piezoelectric element, but a superposing circuit may be provided to superpose the polarization recovery voltage on the position control voltage, and the superposed voltage may be applied as polarization recovery voltage. For example, FIG. 15 and FIG. 16 show examples of impression of polarization recovery voltage by superposing on the position control voltage.

Figure 15:
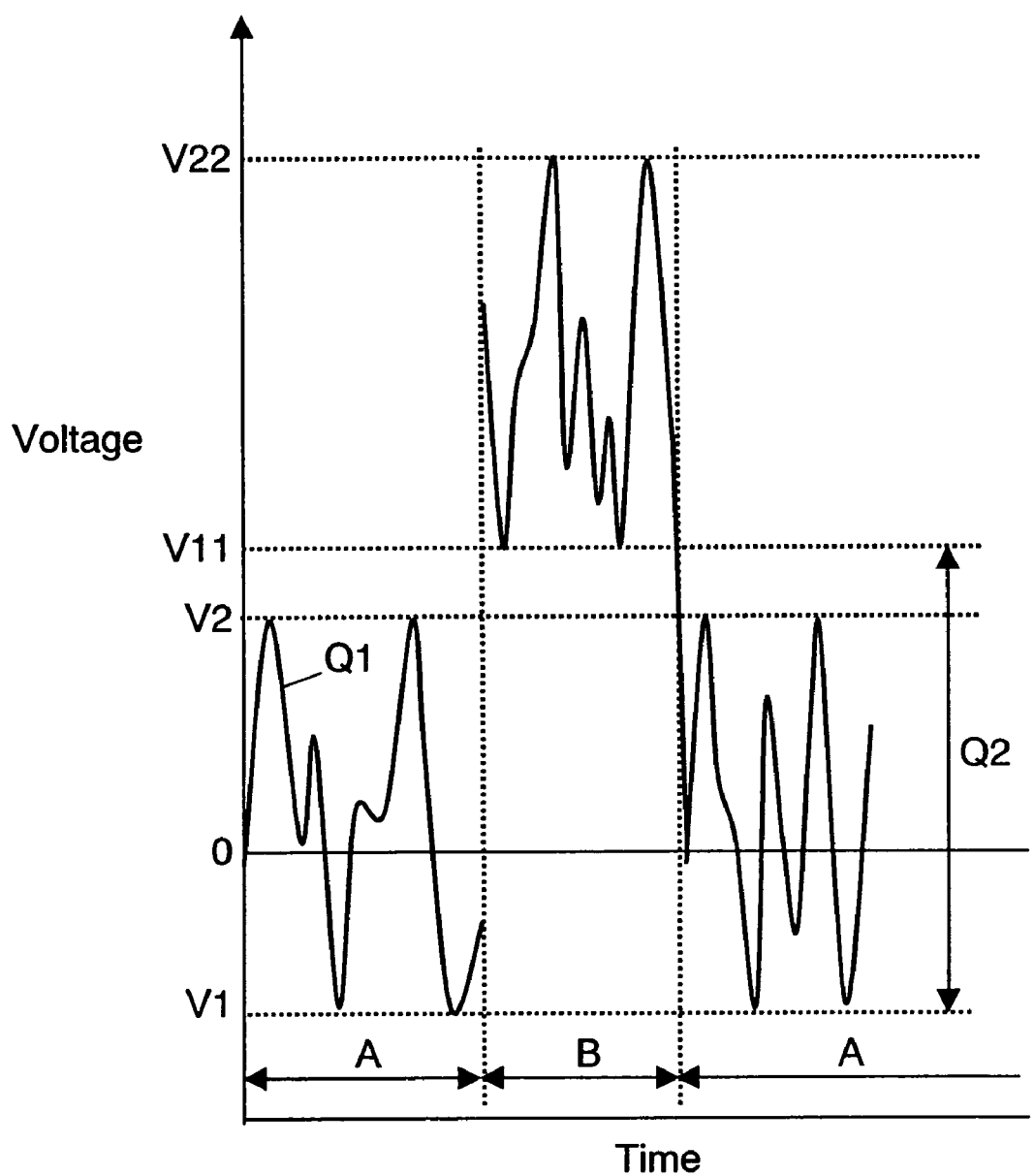
FIG. 15 shows a voltage impression method of restoring polarization (time indicated by region B) by superposing polarization recover Q2 while controlling the position (time indicated by region A) by applying position control voltage Q1 between voltage V1 and V2.

FIG. 15 shows a voltage impression method of restoring polarization (time indicated by region B) by superposing polarization recovery voltage Q2 while controlling the position (time indicated by region A) by applying position control voltage Q1 between voltage V1 and V2. The polarization recovery voltage Q2 is a voltage equivalent to (V11−V1), and it is superposed on the position control voltage Q1 and applied. As a result, the polarization is restored while controlling the position. The track position for position control during polarization recovery process is to control at a different position from the position of control ion region A.

Figure 16:
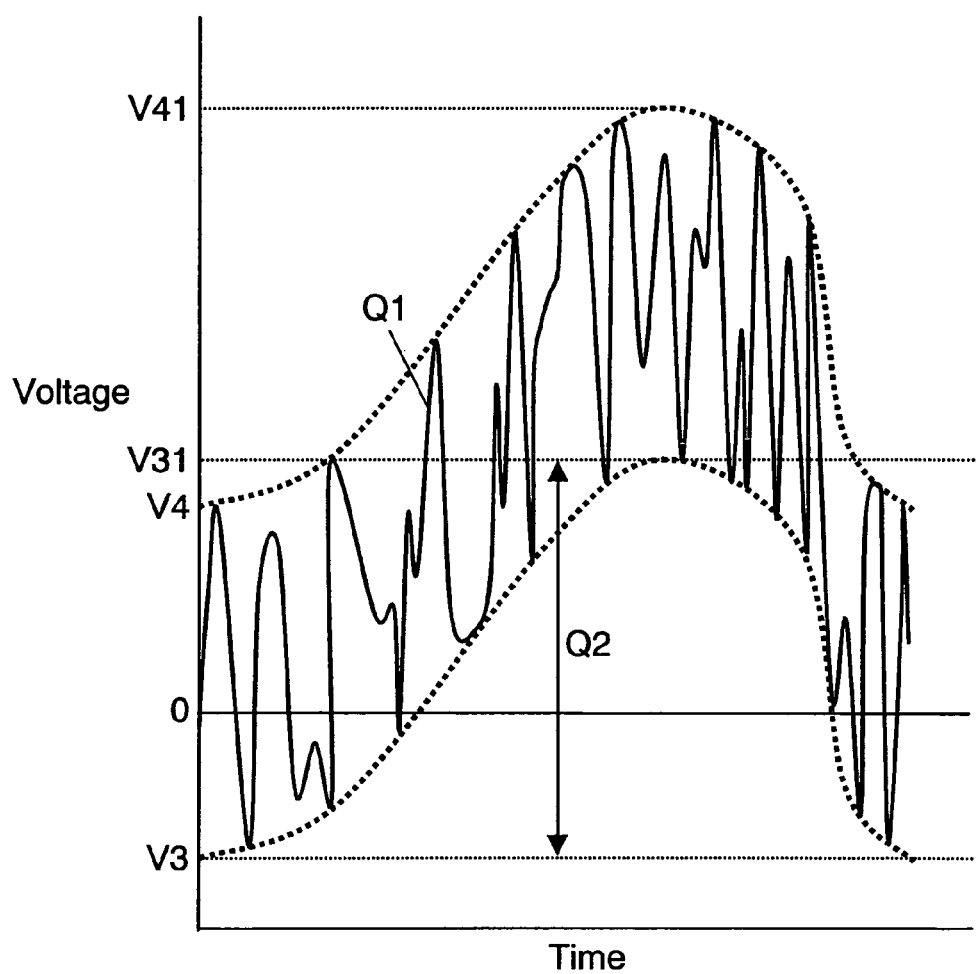
FIG. 16 shows a method of impression of polarization recovery voltage Q2 to the piezoelectric element while increasing continuously from the position control voltage Q1.

FIG. 16 shows a method of impression of polarization recovery voltage Q2 to the piezoelectric element while increasing continuously from the position control voltage Q1. In this case, too, the track position for position control moves gradually, but position control is possible at every moving point, and polarization recovery is processed in parallel.

In these cases, if the polarization recovery voltage exceeds a preset voltage, a limiting circuit is actuated to limit the voltage within the preset value to be applied. As clear from the description herein, the operation of applying the polarization recovery voltage and restoring the polarization can be executed at ordinary temperature, and the recovery operation can be executed while the piezoelectric actuator is assembled in the apparatus.

Also in the exemplary embodiments, the piezoelectric elements have P-E hysteresis curve with positive coercive field $E_{c2}$ smaller than negative coercive field $E_{c1}$ and polarization in positive direction, but the invention is not limited to these examples. That is, in the case of a piezoelectric element having P-E hysteresis curve having positive coercive field $E_{c2}$ larger than negative coercive field $E_{c1}$, the same effects are obtained by applying a voltage in reverse direction on the basis of the polarization in negative direction.

Further, by driving the piezoelectric actuator, fluctuations of displacement of piezoelectric element in a state of using the disk apparatus can be detected, and when the fluctuation reaches a preset level, polarization recovery voltage for restoring polarization can be applied, and a constant displacement is always obtained, so that fine adjustment of high precision is realized.

What is claimed is:

1. A method of driving a piezoelectric actuator,
    wherein a piezoelectric element has an asymmetrical hysteresis characteristic of polarization-electric field different in each of absolute values of a coercive field of positive electric field and a coercive field of negative electric field, the method comprising the steps of:
polarizing the piezoelectric element in a film thickness direction thereof and in a direction of electric field of smaller absolute value in comparison with the coercive field of the positive electric field and the coercive field of the negative electric field; and
applying, as a position control voltage for position control by distorting said piezoelectric element in a direction orthogonal to the film thickness direction of said piezoelectric element, a voltage equivalent to an electric field of 0.4 or less of said large absolute value in the film thickness direction of said piezoelectric element in a direction of electric field of larger absolute value between the absolute value of the coercive field of the positive electric field and the coercive field of the negative electric field.

2. A method of driving a piezoelectric actuator,
wherein a piezoelectric element has an asymmetrical hysteresis characteristic of polarization-electric field different in each of absolute values of a coercive field of positive electric field and a coercive field of negative electric field, the method comprising the steps of:
polarizing the piezoelectric element in a film thickness direction thereof and in a direction of electric field of smaller absolute value between the coercive field of the positive electric field and the coercive field of the negative electric field; and
applying, as a position control voltage for position control by distorting said piezoelectric element in a direction orthogonal to the film thickness direction of said piezoelectric element, a voltage equivalent to not more than the absolute value of a midpoint of the coercive field of the positive electric field and the coercive field of the negative electric field, in comparison with each of absolute values of the coercive field of the positive electric field and the coercive field of the negative electric field.

3. A driving method of piezoelectric actuator, the method comprising the steps of:
applying a position control voltage to a piezoelectric element polarized in a film thickness direction, in the film thickness direction of said piezoelectric element, and the positioning of the piezoelectric element is controlled by distorting in a direction orthogonal to the film thickness direction, and
wherein during said positioning, a polarization recovery voltage for recovering from deterioration of polarization is temporarily superposed and temporarily applied on the position control voltage, or
the polarization recovery voltage for recovering from deterioration of polarization is temporarily applied by changing over with the position control voltage in a film thickness direction of the piezoelectric element, or
the polarization recovery voltage for recovering from deterioration of polarization is temporarily applied in a film thickness direction of the piezoelectric element when the position control voltage is not applied.
wherein said piezoelectric element has an asymmetrical hysteresis characteristic of polarization-electric field different in absolute values between a coercive field of positive electric field and a coercive field of negative electric field, and its polarizing direction is the film thickness direction of said piezoelectric element and a direction of smaller absolute value in comparison with the coercive field of the positive electric field and the coercive field of the negative electric field.

4. The driving method of piezoelectric actuator of claim 3, wherein the impression time of said polarization recovery voltage is 0.01 second or more to 60 seconds or less.

5. The driving method of piezoelectric actuator of claim 3, wherein said polarization recovery voltage is applied intermittently.

6. The driving method of piezoelectric actuator of claim 3, further comprising:
detecting means for detecting fluctuations of displacement of said piezoelectric element,
wherein said polarization recovery voltage is applied to said piezoelectric element when the displacement becomes smaller than a preset level.

7. The driving method of piezoelectric actuator of any one of claims 1, 2 and 3, wherein said piezoelectric element is composed of a first conductor, a second conductor, and a piezoelectric thin film enclosed between said first conductor and said second conductor.

8. The driving method of piezoelectric actuator of any one of claims 1, 2 and 3, wherein said piezoelectric element is a laminated piezoelectric composition composed by using two pieces each of first conductors, second conductors, and piezoelectric thin films enclosed between said first conductors and said second conductors, and adhering said second conductors with each other.

9. A piezoelectric actuator comprising:
a piezoelectric element having an asymmetrical hysteresis characteristic of polarization-electric field different in absolute values between a coercive field of positive electric field and a coercive field of negative electric field, being polarized in the film thickness direction of said piezoelectric element and in a direction of smaller absolute value between the absolute value of the coercive field of the positive electric field and the coercive field of the negative electric field, and
a control circuit including a position control voltage circuit for applying a position control voltage for controlling the position by distorting said piezoelectric element in a direction orthogonal to the film thickness direction, said control circuit further includes a polarization recovery voltage circuit for applying a polarization recovery voltage for restoring the polarization of said piezoelectric element.

10. A piezoelectric actuator comprising:
a piezoelectric element polarized in a film thickness direction,
a position control voltage circuit for applying a position control voltage for controlling the position by distorting said piezoelectric element in a direction orthogonal to the film thickness direction,
a polarization recovery voltage circuit for applying a polarization recovery voltage for restoring the polarization of said piezoelectric element, and
a control circuit for controlling said position control voltage circuit and said polarization recovery voltage circuit,
wherein said piezoelectric element has an asymmetrical hysteresis characteristic of polarization-electric field different in absolute values between a coercive field of positive electric field side and a coercive field of negative electric field side, and is polarized in the film thickness direction of said piezoelectric element and in a direction of smaller absolute value of said coercive field.

11. The piezoelectric actuator of claim 9 or 10, wherein said control circuit further includes a switch circuit for changing over said position control voltage circuit and said polarization recovery voltage circuit.

12. The piezoelectric actuator of claim 9 or 10, wherein said control circuit further includes a superposing circuit for superposing said polarization recovery voltage on said position control voltage.

13. The piezoelectric actuator of claim 12, wherein said control circuit further includes a limiting circuit for limiting the output voltage issued from said superposing circuit to a preset voltage.

14. The piezoelectric actuator of claim 9 or 10, wherein said piezoelectric element is composed of a first conductor, a second conductor, and a piezoelectric thin film enclosed between said first conductor and said second conductor.

15. The piezoelectric actuator of claim 9 or 10, wherein said piezoelectric element is a laminated piezoelectric composition composed by using two pieces each of first conductors, second conductors, and piezoelectric thin films enclosed between said first conductors and said second conductors, and adhering said second conductors with each other.

16. The piezoelectric actuator of claim 9 or 10, wherein said piezoelectric element is composed of a pair, each one of said pair comprising a first conductor, a second conductor, and a piezoelectric thin film enclosed between said first conductor and said second conductor, and the individual ones of said first conductor, said second conductor, and said piezoelectric thin film enclosed between said first conductor and said second conductor are disposed mirror-symmetrically on a same plane, on the basis of a plane orthogonal to said plane.

17. The piezoelectric actuator of claim 9 or 10, wherein said piezoelectric element is a pair of laminated piezoelectric compositions each composed by using two pieces each of first conductors, second conductors, and piezoelectric thin films enclosed between said first conductors and said second conductors, and adhering said second conductors with each other, and the individual ones of said laminated piezoelectric compositions are disposed mirror-symmetrically on a same plane, on the basis of a plane orthogonal to said plane.

18. A head support mechanism comprising:
a head for at least recording or reproducing,
a head slider on which said head is mounted,
a flexure to which said head slider is attached, and
a piezoelectric actuator including a piezoelectric element fixed on said flexure adjacently to said slider, and a control circuit for controlling the position by expanding or contracting said piezoelectric element,
wherein said piezoelectric actuator is a piezoelectric actuator of claim 16.

19. A head support mechanism comprising:
a head for at least recording or reproducing,
a head slider on which said head is mounted,
a flexure to which said head slider is attached, and
a piezoelectric actuator including a piezoelectric element fixed on said flexure adjacently to said slider, and a control circuit for controlling the position by expanding or contracting said piezoelectric element,
wherein said piezoelectric actuator is a piezoelectric actuator of claim 17.

20. A disk recording and reproducing apparatus comprising:
a disk recording medium,
a head for at least recording or reproducing in said disk recording medium,
a head slider on which said head is mounted,
a flexure to which said head slider is attached,
a piezoelectric actuator including a piezoelectric element fixed on said flexure adjacently to said slider, and
a control circuit for controlling the position by expanding or contracting said piezoelectric element, an arm for supporting said flexure, a bearing for rotatably supporting said arm, and rotating means for rotating said arm in a radial direction of said disk recording medium,
wherein said piezoelectric actuator is a piezoelectric actuator of claim 16.

21. A disk recording and reproducing apparatus comprising:
a disk recording medium,
a head for at least recording or reproducing in said disk recording medium,
a head slider on which said head is mounted,
a flexure to which said head slider is attached,
a piezoelectric actuator including a piezoelectric element fixed on said flexure adjacently to said slider, and
a control circuit for controlling the position by expanding or contracting said piezoelectric element, an arm for supporting said flexure, a bearing for rotatably supporting said arm, and rotating means for rotating said arm in a radial direction of said disk recording medium,
wherein said piezoelectric actuator is a piezoelectric actuator of claim 17.

22. The disk recording and reproducing apparatus of claim 20 or 21, further comprising:
a level detecting circuit for detecting the difference of an output level of middle position of recording track of said disk recording medium and an output level by impression of a preset position control voltage to the piezoelectric element, when reading out servo signal recorded in said disk recording medium by said head,
wherein a polarization recovery voltage is applied from said control circuit when the difference of said levels becomes smaller than a preset level.

* * * * *